(12) United States Patent
Hashimoto et al.

(10) Patent No.: US 9,837,105 B2
(45) Date of Patent: Dec. 5, 2017

(54) MAGNETORESISTIVE ELEMENT, METHOD OF MANUFACTURING MAGNETORESISTIVE ELEMENT, MAGNETIC HEAD, AND MAGNETIC RECORDING/REPRODUCING DEVICE

(71) Applicant: KABUSHIKI KAISHA TOSHIBA, Tokyo (JP)

(72) Inventors: Susumu Hashimoto, Tokyo (JP); Satoshi Shirotori, Kanagawa (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/200,454

(22) Filed: Jul. 1, 2016

(65) Prior Publication Data

US 2017/0011757 A1    Jan. 12, 2017

(30) Foreign Application Priority Data

Jul. 6, 2015 (JP) .................................. 2015-135356

(51) Int. Cl.
*G11B 5/39* (2006.01)
*G01R 33/09* (2006.01)
(Continued)

(52) U.S. Cl.
CPC ............ *G11B 5/3909* (2013.01); *G01R 33/09* (2013.01); *G01R 33/098* (2013.01);
(Continued)

(58) Field of Classification Search
CPC ................................ G11B 5/39; G11B 5/3909
(Continued)

(56) References Cited

U.S. PATENT DOCUMENTS 6,332,967 B1 * 12/2001 Bhattacharya ...... C04B 35/4512
    205/170
7,826,180 B2   11/2010 Tsuchiya et al.
(Continued)

FOREIGN PATENT DOCUMENTS

JP    2008-10882    1/2008
JP    2008-16741    1/2008
(Continued)

OTHER PUBLICATIONS

H. Fukuzawa at al., CPP-GMR films with a current-confined-path nano oxide layer (CCP-NOL), Journal of Physics D: Applied Science, vol. 40, pp. 1213-1220 (2007).
(Continued)

*Primary Examiner* — Allen T Cao
(74) *Attorney, Agent, or Firm* — Finnegan, Henderson, Farabow, Garrett & Dunner, L.L.P.

(57) ABSTRACT

A magnetoresistive element according to an embodiment includes: a first magnetic layer, a second magnetic layer, and an intermediate layer disposed between the first magnetic layer and the second magnetic layer, the intermediate layer including: a first layer containing oxygen and at least one element of Cu, Au, and Ag; and a second layer containing Mg and oxygen, the second layer being disposed between the first layer and the second magnetic layer.

13 Claims, 18 Drawing Sheets

(51) Int. Cl.
*H01L 43/08* (2006.01)
*H01L 43/10* (2006.01)
*H01F 10/32* (2006.01)

(52) U.S. Cl.
CPC ....... *G11B 5/3906* (2013.01); *H01F 10/3259* (2013.01); *H01L 43/08* (2013.01); *H01L 43/10* (2013.01); *H01F 10/3272* (2013.01)

(58) Field of Classification Search
USPC .......................................................... 360/313
See application file for complete search history.

(56) References Cited

U.S. PATENT DOCUMENTS

| | | | |
|---|---|---|---|
| 8,169,752 B2 | 5/2012 | Fukuzawa et al. | |
| 8,379,350 B2 | 2/2013 | Matsuzawa et al. | |
| 8,564,904 B2 | 10/2013 | Iwasaki et al. | |
| 8,778,515 B2 | 7/2014 | Sato et al. | |
| 8,824,108 B2 | 9/2014 | Fuji et al. | |
| 9,013,837 B2 | 4/2015 | Hase et al. | |
| 9,047,891 B1 | 6/2015 | Childress et al. | |
| 9,117,465 B2 | 8/2015 | Kamiguchi et al. | |
| 9,153,771 B2 | 10/2015 | Nakada et al. | |
| 9,214,171 B2 | 12/2015 | Isowaki et al. | |
| 2002/0114974 A1* | 8/2002 | Carey | B82Y 10/00 428/811 |
| 2003/0026049 A1* | 2/2003 | Gill | B82Y 10/00 360/324.12 |
| 2009/0086383 A1* | 4/2009 | Hara | B82Y 25/00 360/324 |
| 2009/0086385 A1* | 4/2009 | Gill | B82Y 10/00 360/324.11 |
| 2009/0161268 A1* | 6/2009 | Lin | B82Y 10/00 360/324.11 |
| 2010/0091414 A1* | 4/2010 | Yuasa | B82Y 10/00 360/324 |
| 2010/0092803 A1* | 4/2010 | Yuasa | B82Y 10/00 428/846 |
| 2010/0232066 A1* | 9/2010 | Hara | B82Y 10/00 360/234.3 |
| 2012/0206837 A1* | 8/2012 | Fuji | G01R 33/093 360/254 |
| 2013/0128391 A1* | 5/2013 | Fuji | B82Y 10/00 360/324.12 |

FOREIGN PATENT DOCUMENTS

| | | |
|---|---|---|
| JP | 2009-10333 | 1/2009 |
| JP | 2009-164182 | 7/2009 |
| JP | 2010-113752 | 5/2010 |
| JP | 2012-15489 | 1/2012 |
| JP | 2012-203916 | 10/2012 |
| JP | 2013-197205 | 9/2013 |
| JP | 2014-203471 | 10/2014 |
| JP | 2014-220028 | 11/2014 |
| JP | 2014-229660 | 12/2014 |
| JP | 2015-26741 | 2/2015 |

OTHER PUBLICATIONS

A. Neggache et al., "Testing epitaxial $Co_{1.5}Fe_{1.5}Ge(001)$ electrodes in MgO-based magnetic tunnel junctions", Applied Physics Letters, vol. 104, pp. 252412-1-252414 (6 pages total) (2014).

* cited by examiner

|  | MATERIAL OF LAYER $13_3$ | $\Delta R/R$ (%) | |
|---|---|---|---|
|  |  | Tan=290°C | Tan=380°C |
| COMPARATIVE EXAMPLE 1 | Si(0.5) | 7 | 15 |
| COMPARATIVE EXAMPLE 2 | Al(0.3)/Cu(0.5) | 11 | 9 |
| COMPARATIVE EXAMPLE 3 | Al(0.3)/Si(0.5) | 10 | 25 |
| COMPARATIVE EXAMPLE 4 | Al(0.3)/Si(0.5)/Cu(0.3) | 8 | 26 |
| EXAMPLE 3 | Al(0.3)/Mg(0.5) | 16 | 36 |

FIG. 7

| MAGNETIC LAYER 14 | LAYER INSERTED INTO INTERFACE BETWEEN INTERMEDIATE LAYER 13 AND MAGNETIC LAYER 14 | ΔR/R (%) |
|---|---|---|
| $Fe_{35}Co_{35}Ge_{30}$ | N/A | 30 |
| $Fe_{35}Co_{35}Ge_{30}$ | FeCo(1nm) | 25 |
| $Co_{47}Fe_{13}Mn_{15}Si_{25}$ | N/A | 23 |
| $Co_{47}Fe_{13}Mn_{15}Si_{25}$ | FeCo(1nm) | 26 |
| $Co_{47}Fe_{13}Mn_{15}Ge_{25}$ | N/A | 33 |
| $Co_{47}Fe_{13}Mn_{15}Ge_{25}$ | FeCo(1nm) | 24 |

| FILM FORMATION STRUCTURE OF OXIDE LAYER $13_2$ | ΔR/R (%) | |
|---|---|---|
| | Tan=290°C | Tan=380°C |
| Al(1) | 12 | 27 |
| Mg(0.3)/Al(1) | 13 | 26 |
| Mg(0.5)/Al(1) | 17 | 36 |
| Mg(1)/Al(1) | 15 | 29 |
| Si(0.5)/Al(1) | 8 | 31 |

MAGNETORESISTIVE ELEMENT, METHOD OF MANUFACTURING MAGNETORESISTIVE ELEMENT, MAGNETIC HEAD, AND MAGNETIC RECORDING/REPRODUCING DEVICE

CROSS REFERENCE TO RELATED APPLICATIONS

This application is based upon and claims the benefit of priority from prior Japanese Patent Application No. 2015-135356 filed on Jul. 6, 2015 in Japan, the entire contents of which are incorporated herein by reference.

FIELD

Embodiments described herein relate generally to a magnetoresistive element, a method of manufacturing a magnetoresistive element, a magnetic head, and a magnetic recording/reproducing device.

BACKGROUND

In a magnetic recording device such as a HDD (Hard Disk Drive), a TMR (Tunneling Magneto Resistance) element is used as a reproducing element. The TMR element includes a magnetization pinned layer having a pinned magnetization direction, a magnetization free layer having a variable magnetization direction, and an intermediate layer interposed between the magnetization pinned layer and the magnetization free layer. In this structure, a tunneling-conduction oxide is used as the intermediate layer.

To increase recording density, the track width needs to be reduced, and, along with this request, there is a demand for a reproducing element having a smaller size in the track width direction.

Meanwhile, to reduce the size of a reproducing element and achieve a high transfer rate and a high S/N ratio, a reproduction resistance of 0.5 kΩ to 1 kΩ should be maintained. As a result, the areal resistance RA of the intermediate layer needs to be lowered. If the areal resistance RA is too low, a noise problem occurs due to spin torque, and it becomes difficult to increase current, resulting in difficulties in achieving high outputs. In view of this, a TMR element having an areal resistance RA between 0.1 $\Omega\mu m^2$ and 0.2 $\Omega\mu m^2$ is desirable. However, the decrease in the areal resistance of a TMR element is reaching its limit (approximately 0.3 $\Omega\mu m^2$), and there is a demand for a novel structure or material for the intermediate layer.

In response to such a demand, a current-constricting structure has been developed. The current-constricting structure has a metal conducting path in part of the insulating oxide layer serving as the intermediate layer. However, where a reproducing element using this current-constricting structure is made smaller in size, the number of conducting paths becomes smaller, resulting in wider variation in areal resistance.

In view of this, an intermediate layer containing a novel low-resistance oxide that differs from a tunneling-conduction oxide has recently been suggested through a different approach from the current-constricting structure. A first known example of such a low-resistance oxide layer is Cu/Zn—O/Zn, a second known example is Cu/Ga—O/ZnO, and a third known example is Cu/InZnO/Zn, in any of these examples, Cu, Ag, or the like is used immediately below the oxide layer. Therefore, the MR change rate or ΔR/R is 15% to 30%, and the areal resistance RA is 0.1 $\Omega\mu m^2$ to 0.3 $\Omega\mu m^2$.

To improve the resolution in the linear recording density direction, on the other hand, the gap between the two reproducing shields sandwiching the TMR element should be narrowed, and the thickness of the TMR element disposed in the gap needs to be reduced. However, the structure of a today's reproducing element includes many layers, such as an antiferromagnetic layer, a pinned layer, a nonmagnetic layer, and a free layer. Because of this, it is difficult to narrow the gap in the reproducing element.

As a means to solve this problem, a reproducing head including a reproducing element that utilizes a spin accumulation effect has been suggested. In this reproducing element, the antiferromagnetic layer and the pinned layer(s) can be disposed outside the gap. To achieve a high output and a high S/N ratio with this reproducing element, an interfacial oxide layer having an areal resistance RA of approximately 0.1 $\mu m^2$ is preferably inserted into the structure.

BRIEF DESCRIPTION OF THE DRAWINGS

FIG. 7 is a table showing the results of measurement of ΔR/R (%) in a case where MR films of Comparative Examples 1 through 4 were subjected to heat treatments;

DETAILED DESCRIPTION

A magnetoresistive element according to an embodiment includes: a first magnetic layer, a second magnetic layer, and an intermediate layer disposed between the first magnetic layer and the second magnetic layer, the intermediate layer including: a first layer containing oxygen and at least one element of Cu, Au, and Ag; and a second layer containing Mg and oxygen, the second layer being disposed between the first layer and the second magnetic layer.

The following is a detailed description of embodiments, with reference to the accompanying drawings.

First Embodiment

Figure 1:
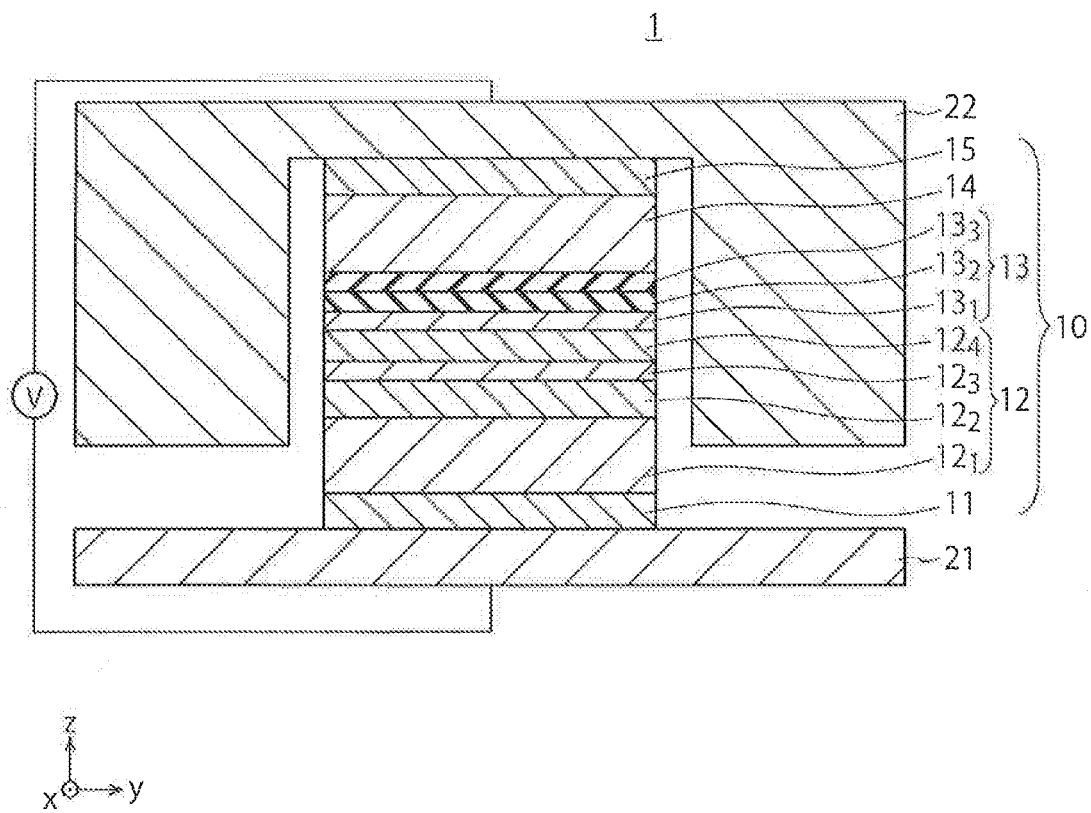
FIG. 1 is a cross-sectional view of a magnetoresistive element of a magnetic head according to a first embodiment.

A magnetic head according to a first embodiment is shown in FIG. 1. The magnetic head of this embodiment includes a magnetoresistive element (hereinafter also referred to as the MR element) 1. The MR element of the first embodiment is a reproducing unit. FIG. 1 is a plan view of the reproducing unit 1 seen from the magnetic recording medium, or is a plan view of the reproducing unit 1 seen from the medium facing surface (hereinafter also referred to as the ABS (Air Bearing Surface)). In FIG. 1, the x-direction is the direction from the reproducing unit 1 toward the magnetic recording medium (not shown), the y-direction is the width direction of the tracks of the magnetic recording medium, and the z-direction is the longitudinal direction of the tracks of the magnetic recording medium.

The reproducing unit 1 includes a magnetoresistive film (hereinafter also referred to as the MR film) 10 including stack structures of magnetic materials to exhibit a magnetoresistive effect, and magnetic shield layers 21 and 22 provided to surround the MR film 10. The MR film 10 has a structure formed by stacking a base layer 11, a first stack structure 12 including a first magnetic layer, a second stack structure 13 serving as an intermediate layer, a second magnetic layer 14, and a cap layer 15 in this order. In this embodiment, the first magnetic layer is a magnetization pinned layer (hereinafter also referred to as the pinned layer) having a pinned magnetization direction, and the second magnetic layer is a magnetization free layer (hereinafter also referred to as the free layer) having a magnetization direction varying with external magnetic fields.

The first stack structure 12 and the free layer 14 may be replaced with each other. That is, the free layer 14 may be provided between the base layer 11 and the second stack structure 13, and the first stack structure 12 may be provided between the second stack structure 13 and the cap layer 15.

The magnetic shield layers 21 and 22 function not only as shields against magnetism, but also as electrodes for applying current perpendicularly to the film plane of the MR film 10. Here, the film plane means a plane perpendicular to the stacking direction of the MR film 10. Accordingly, current flows in the stacking direction of the MR film 10.

The magnetic shield layer 22 may extend to cover part of the side surfaces of the MR film 10 (or the side surfaces of the free layer 14) in the width direction of the tracks (the y-direction). In this case, the magnetic shield layer 22 has a function to apply a magnetization stabilizing bias field to the free layer 14.

In the reproducing unit 1 of this embodiment, the magnetization of the free layer 14 rotates with a magnetic field from the magnetic recording medium, and the angle between the magnetization direction of the magnetization pinned layer in the first stack structure 12 and the magnetization direction of the free layer 14 changes accordingly. The electrical resistance of the reproducing unit 1 changes with this change in the angle, and the change in the electrical resistance is sensed by applying current between the magnetic shield layers 21 and 22, and measuring a change in the voltage between the magnetic shield layers 21 and 22.

(Materials)

Next, the materials of the respective components constituting the magnetoresistive element of this embodiment are described.

A nonmagnetic metal, such as Ta, Ru, or Cu, is used as the base layer 11. The base layer 11 may have a stack structure formed by stacking two or more materials. For example, the base layer 11 may be a Ta/Cu stack structure or a Ta/Ru stack structure. That is, after a Ta layer is formed, a Cu layer or a Ru layer may be formed.

The first stack structure 12 has a structure formed by stacking an antiferromagnetic layer $12_1$, a magnetic layer $12_2$, a nonmagnetic layer $12_3$, and a magnetic layer $12_4$ in this order. IrMn or the like is used as the antiferromagnetic layer $12_1$. A CoFe alloy or the like is used as the magnetic layer $12_2$. A Ru layer or the like having a function to cause the magnetic layer $12_2$ and the magnetic layer $12_4$ to have magnetization directions antiparallel to each other is used as the nonmagnetic layer $12_3$. A Heusler ordered alloy that has high spin polarization and the composition of $Co_{100-x}(A_y B_{1.0-y})_x$ (40 at %≤x≤60 at %, 0.3≤y≤0.7), for example, is used as the magnetic layer $12_4$. Here, A is an alloy containing at least Fe and Mn, and B is an alloy containing at least one element selected from the group consisting of Si, Al, Ga, and Ge, or an alloy such as CoFe, CoFeB, CoFeSi, CoMnGe, CoMnSi, or CoFeAl. The magnetization direction of the stack structure formed with the magnetic layer $12_2$, the nonmagnetic layer $12_3$, and the magnetic layer $12_4$ is pinned by the antiferromagnetic layer $12_1$. Accordingly, the first stack structure 12 functions as a magnetization pinned layer having a magnetization direction that does not change with external magnetic fields.

The magnetic layer 14 preferably includes a layer of a Ge-containing magnetic alloy, such as CoFeMnGe, on the side of the second stack structure 13. However, a FeCo alloy may be used. The magnetic layer 14 preferably further includes a NiFe alloy layer stacked on the side of the cap layer 15, to reduce magnetostriction.

The second stack structure 13 serving as the intermediate layer is a stack structure of nonmagnetic layers, and has a structure formed by stacking a metal layer $13_1$ containing a metal element such as Cu, an oxide layer $13_2$ containing Al or the like, and a Mg layer $13_3$ in this order. As the oxide layer $13_2$ is oxidized through a high-energy process such as plasma oxidation, or is subjected to a heat treatment, the metal element in the metal layer $13_1$ enters the oxide layer $13_2$. The metal element exists in the interface on the side of the magnetic layer 12, and Mg exists in the interface on the side of the magnetic layer 14. Since Mg has greater oxidation affinity than Al, the oxide layer $13_2$ is oxidized with oxygen through a heat treatment. As a result, the Mg layer $13_3$ and the oxide layer $13_2$ are eventually turned into an integrated oxide layer, and an oxide layer containing Mg appears in the interface with the magnetic layer 14. Part (Mg) of the oxide layer may remain as a metal.

Through the above process of forming the oxide layer $13_2$ on the metal layer $13_1$, the oxide layer $13_2$ having an evenly grown layer can be achieved. To facilitate even growth of a layer, the metal layer $13_1$ is preferably a thick layer. If the thickness of the metal layer $13_1$ becomes greater than 1.5 nm, however, the resistance of the interface between the first stack structure 12 and the second stack structure 13 drops to the same value as the resistance of a metal, and the MR change rate (hereinafter also referred to as ΔR/R) decreases rapidly. Therefore, a thickness greater than 1.5 nm is not preferable for the metal layer $13_1$.

Meanwhile, through a postheat treatment or the like, the element in the metal layer $13_1$ may completely enter the oxide layer $13_2$ eventually. Instead of Cu, Ag or Au may be used as the metal layer $13_1$. Alternatively, an alloy containing at least two metal elements selected from the group consisting of Cu, Au, and Ag may be used as the metal layer $13_1$.

Mg or Si may be added to the aluminum in the oxide layer $13_2$. The eventual thickness of the oxide layer $13_2$ is preferably in the neighborhood of 1 nm, so as to achieve a low resistance, or a lower areal resistance RA than $0.3\ \Omega\mu m^2$.

A nonmagnetic metal, such as Ta, Ru, Cu, Ag, Au, Al, or Ti, is used as the cap layer 15.

NiFe alloy layers are used as the magnetic shield layers 21 and 22, for example.

In FIG. 1, the first and second magnetic layers having the stack structure 13 as the intermediate layer interposed in between constitute a perpendicular-current MR element of a spin valve type, with one of the first and second magnetic layers being a magnetization pinned layer, the other one of the first and second magnetic layers being a free layer. That is, the MR element shown in FIG. 1 is an MR element that applies current, in the stacking direction of the MR film 10, between the magnetic shield layer 21 serving as the lower electrode and the magnetic shield layer 22 serving as the upper electrode. Alternatively, the MR element may be a perpendicular-current MR element in which both of the two magnetic layers with the stack structure 13 serving as the intermediate layer being sandwiched therebetween are free layers.

Various MR films that can be used in the magnetoresistive element 1 of the first embodiment will be described below as Examples.

Example 1

Figure 2:
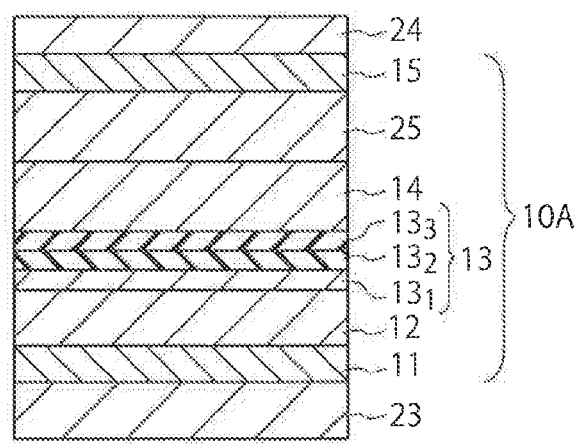
FIG. 2 is a cross-sectional view of an MR film according to Example 1 of the first embodiment.

An MR film according to Example 1 is shown in FIG. 2. The MR film 10A of Example 1 has a structure in which a first magnetic layer 12 is a free layer, a magnetic layer 14 is a pinned layer, and a stack structure 13 as the intermediate layer is interposed between the first magnetic layer 12 and the magnetic layer 14. That is, the MR film 10A of Example 1 has a structure formed by stacking a base layer 11, the first magnetic layer 12, the stack structure 13 as the intermediate layer, the second magnetic layer 14, an antiferromagnetic layer 25, a cap layer 15, and an upper electrode 24, in this order, on a lower electrode 23.

Next, a method of manufacturing the MR film 10A of Example 1 is described.

First, the lower electrode 23 having a stack structure is formed by stacking a 2-nm thick Ta layer, a 200-nm thick Cu layer, and a 20-nm Ta layer in this order on thermally-oxidized silicon, and smoothing the stack structure by CMP (Chemical Mechanical Polishing). A 2-nm thick Ta layer and a 5-nm thick Cu layer are formed in this order as the base layer 11 on the stack structure. A magnetic layer is formed as the free layer 12 on the base layer 11 by stacking a FeCo layer (5 nm in thickness) and a FeCoAl layer (10 at % in Al density, and 5 nm in thickness).

A 0.5-nm thick Cu layer is formed as a metal layer $13_1$ on the free layer 12, and an AlMg oxide layer having a composition ratio of 2:1 (Al:Mg) is formed as an oxide layer $13_2$. To form this AlMg oxide layer, a 0.5-nm thick Mg layer is first formed on the metal layer $13_1$, a 1.0-nm thick Al layer is formed on the Mg layer, and a surface oxidation treatment with ion-beams is then conducted. The eventual thickness is adjusted by changing the time of the ion etching to be conducted after the oxidation treatment.

A Mg layer containing oxygen is then formed as an oxide layer $13_3$ on the oxide layer $13_2$. The Mg layer $13_3$ containing oxygen is formed by conducting a heat treatment after the Mg layer is formed. Through this heat treatment, oxygen from the oxide layer $13_2$ is absorbed by the Mg layer, and the Mg layer $13_3$ containing oxygen is formed.

A 4.5-nm thick FeCo layer is then formed as the second magnetic layer 14. The antiferromagnetic layer 25 that has a thickness of 7 nm and is made of IrMn is formed on the FeCo layer 14. A 2-nm thick Cu layer and a 2-nm thick Ta layer are formed and stacked in this order as the cap layer 15 on the antiferromagnetic layer 25. The upper electrode 24 is then formed by stacking a 30-nm thick Cu layer and a 20-nm thick Ru layer on the cap layer 15. In this manner, a sample of the MR film 10A of Example 1 is manufactured.

In the sample of the MR film 10A formed in this manner, ion beams are emitted to the surface of the oxide layer $13_2$, and part of the metal layer $13_1$ is mixed with the oxide layer $13_2$ by virtue of the energy of the ion beams. The Cu in the metal layer $13_1$ is not easily oxidized, compared with Al and Mg. Therefore, the Cu does not bind with oxygen or any other element in the oxide layer, but enters the oxide layer as a metal element.

Comparative Example

As a comparative example, a sample that was the same as the MR film 10A shown in FIG. 2, except for not including the metal layer $13_1$ made of Cu, was manufactured. In this manufacture, the same process as in Example 1 was used, except for not forming of the metal layer $13_1$.

After the sample of Example 1 and the sample of the comparative example were manufactured, these samples were subjected to a 1-hour heat treatment at 290° C. in a magnetic field as the first heat treatment, and MR change rates (ΔR/R) and areal resistances RA were measured by CIPT (Current In-Plane Tunneling).

After that, measurement was carried out by an additional heat treatment in a magnetic field and CIPT at 320° C., 350° C., 380° C., and 400° C. By CIPT, MR change rates and RA can be evaluated, though the samples are not processed into the form of devices.

Figure 3A:
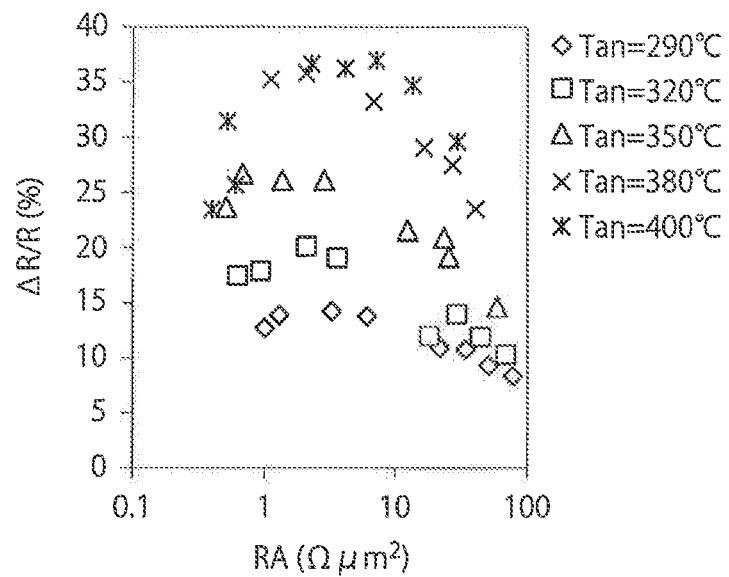
FIG. 3A is a graph showing the relationship between MR change rates (ΔR/R) and areal resistances RA in the MR film of Example 1.
Figure 3B:
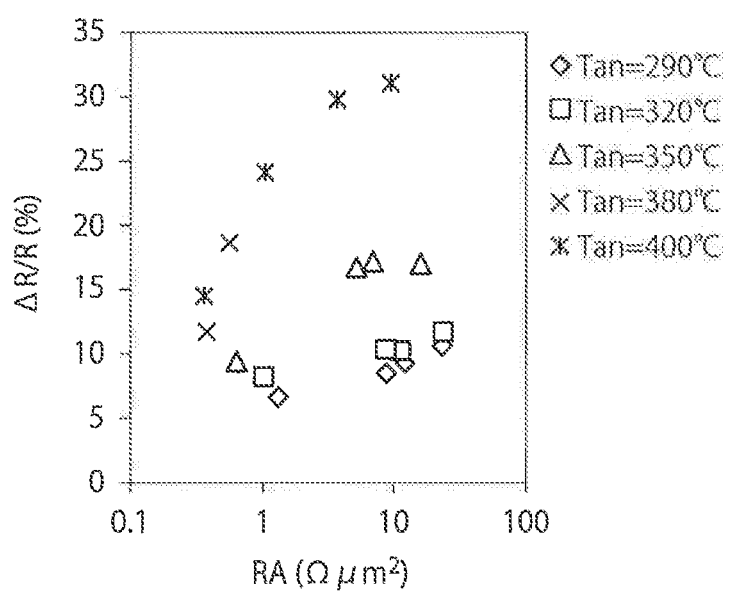
FIG. 3B is a graph showing the relationship between MR change rates (ΔR/R) and areal resistances RA in the MR film of Comparative Example.

FIGS. 3A and 3B show the relationship between the measured MR change rates (ΔR/R) and the measured areal resistances RA of the sample of Example 1 and the sample of the comparative example, respectively, with heat treatment temperatures Tan being the parameters. As can be seen from FIGS. 3A and 3B, the areal resistance RA and the thickness of the oxide layer $13_2$ vary with heat treatment temperatures.

As can be seen from FIG. 3A, in the sample of Example 1 including the metal layer $13_1$, the MR change rate gradually increases as the areal resistance RA decreases, at any heat treatment temperature. A higher MR change rate (ΔR/R) can be achieved at a higher heat treatment temperature. With a lower areal resistance RA than 1 Ωμm², a higher MR change rate ΔR/R than 30% can be achieved at a heat treatment temperature between 380° C. and 400° C.

As can be seen from FIG. 3B, in the sample of the comparative example not including the metal layer $13_1$, the same MR change rate ΔR/R as in Example 1 can be achieved with a higher areal resistance RA than 10 Ωμm². However, the MR change rate ΔR/R becomes lower as the areal resistance RA decreases, and the MR change rate ΔR/R is lower than 20% with a lower areal resistance RA than 1 Ωμm² even if the heat treatment temperature is increased.

The relationship in which the MR change rate ΔR/R becomes lower as the areal resistance RA decreases is common among tunneling-conduction MR films, and the comparative example without Cu, or the sample shown in FIG. 3B, indicates tunneling conduction.

Meanwhile, the relationship in which the MR change rate becomes higher while the areal resistance RA is low because of the existence of the metal layer $13_1$ indicates an MR expression mechanism different from tunneling conduction. This is supposedly because Cu entered the oxide layer $13_2$, and the conduction mechanism of the oxide layer $13_2$, changed.

Figure 4A:
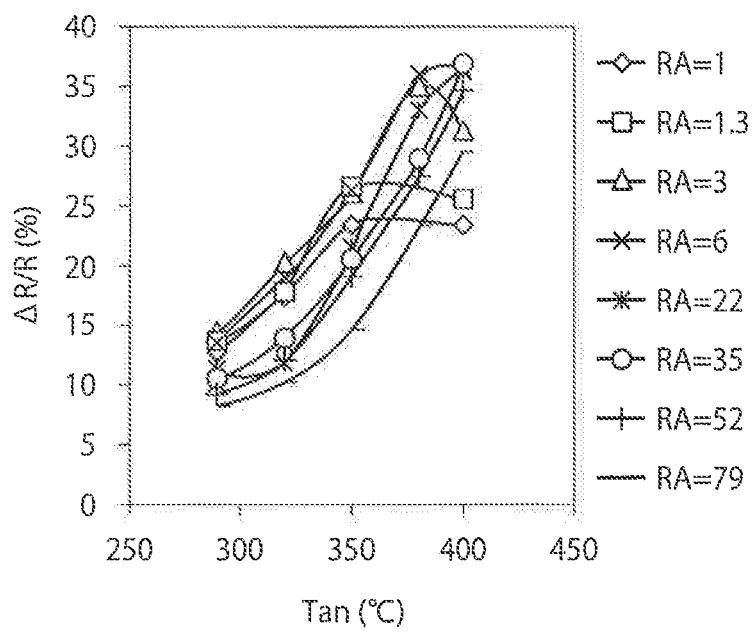
FIG. 4A is a graph showing the relationship between ΔR/R and heat treatment temperatures Tan in Example 1.
Figure 4B:
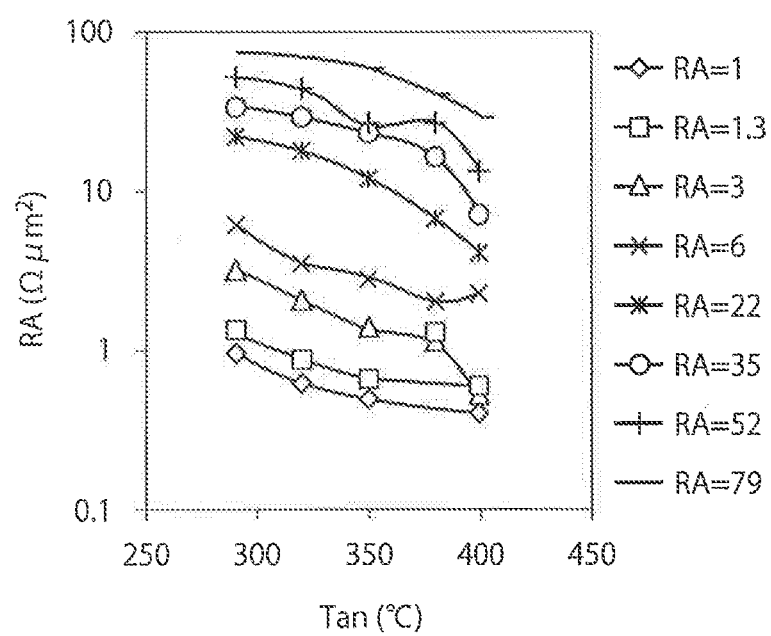
FIG. 4B is a graph showing the relationship between areal resistances RA and heat treatment temperatures Tan in Example 1.

FIGS. 4A and 4B show the relationship between MR change rates ΔR/R and heat treatment temperatures Tan, and the relationship between areal resistances RA and heat treatment temperatures Tan, respectively. These relationships were determined from the data related to the sample of Example 1 shown in FIG. 3A. The areal resistances RA of the respective samples in the graphs are the values obtained after a heat treatment at 290° C. It is apparent that, as the heat treatment temperature increases, the areal resistance RA decreases, and the MR change rate ΔR/R increases.

The effect to increase the MR change rate ΔR/R is much greater than in a case where the areal resistance RA is lowered by changing the thickness of the oxide layer $13_2$ while the heat treatment temperature is maintained at the same temperature. As the heat treatment temperature becomes higher, the Mg metal layer $13_3$ reduces an Al or Cu oxide, and the resistance of the oxide layer becomes lower. As a result, the MR change rate ΔR/R increases. This is apparent from the fact that the quality of the oxide layer greatly changes through the heat treatment, and an increase in MR can be achieved with a decrease in the areal resistance RA.

Example 2

Figure 5:
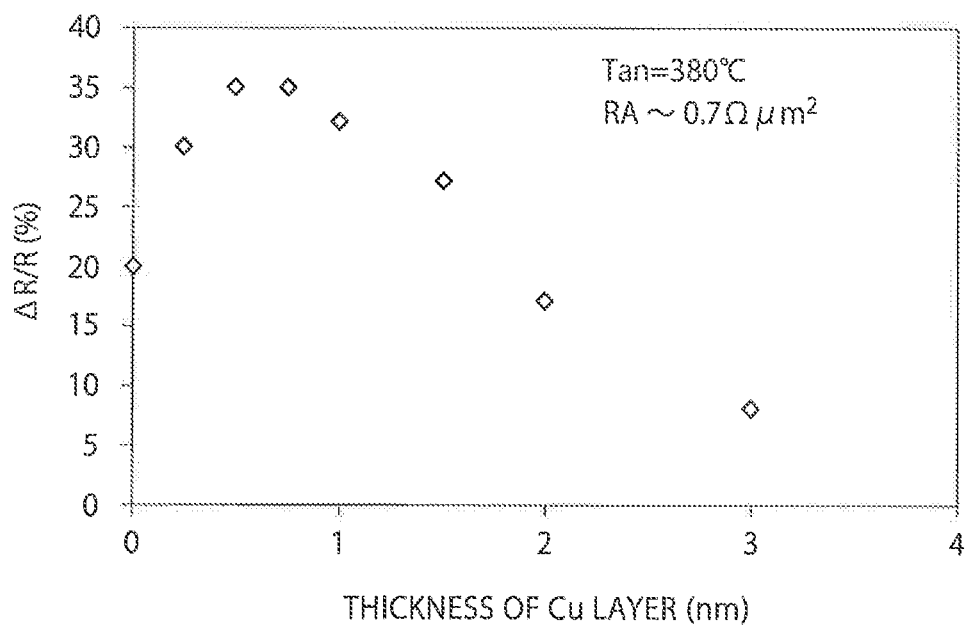
FIG. 5 is a graph for explaining the relationship between ΔR/R and thicknesses of a metal layer in Example 2.

Referring now to FIG. 5, Example 2 will be described. FIG. 5 is a graph for explaining the relationship between ΔR/R and thicknesses of the metal layer $13_1$. First, samples that were the same as the MR film 10A of Example 1 shown in FIG. 2, except that the thickness of the Cu layer in the metal layer $13_1$ was varied from 0 nm to 3 nm, were manufactured. These samples were subjected to a heat treatment at 380° C., and were adjusted so that the areal resistances RA became approximately 0.7 Ωμm². The MR change rates (ΔR/R) of these samples were measured. FIG. 5 shows the relationship between MR change rates and Cu layer thicknesses.

As shown in FIG. 3B, ΔR/R is 20% in the comparative example without the metal layer $13_1$. Where the thickness of the Cu layer is 0.25 nm, the MR change rate (ΔR/R) increases to approximately 30%. Where the thickness of the Cu layer is further increased, ΔR/R also becomes higher. Where the thickness of the Cu layer is approximately 0.5 nm, ΔR/R exhibits its maximum value. Where the thickness of the Cu layer further increases, ΔR/R gradually decreases. Where the thickness of the Cu layer is 1.5 nm, ΔR/R is higher than 20%, and an effect of the existence of the metal layer $13_1$ is observed. Where the thickness of the Cu layer becomes greater than 1.5 nm, the effect of the metal layer $13_1$ disappears. As can be seen from FIG. 3B, where the thickness of the metal layer $13_1$ is at least 0.25 nm, the MR change rate can be made higher.

In a perpendicular-current MR element, the MR change rate greatly decreases, if there is a large difference in resistance between the two magnetic layers sandwiching the intermediate layer and the interfaces with the intermediate layer. Where the metal layer $13_1$ is too thick, the resistance of the interface between the metal layer $13_1$ and the magnetic layer 12 greatly decreases. Because of this, the effect of the metal layer $13_1$ to increase the MR change rate was lost.

In view of the above, the MR change rate can be increased, as long as the thickness of the metal layer $13_1$ during film formation is between 0.25 nm and 1.5 nm. Since a certain amount of Cu in the layer enters the oxide layer $13_2$, the thickness of the Cu layer in the eventual form is smaller than the thickness of the Cu layer during film formation.

Example 3

Figure 6:
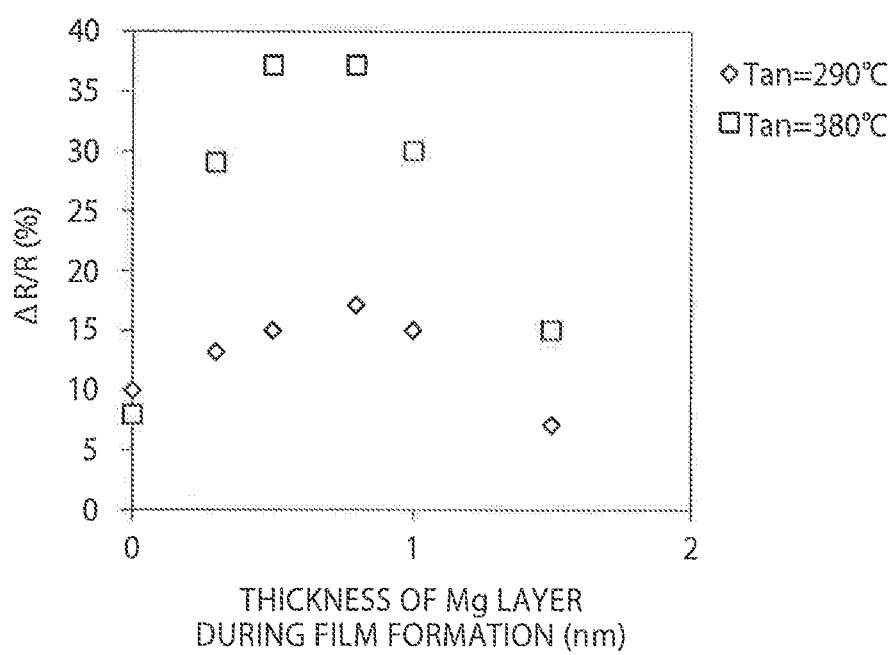
FIG. 6 is a graph showing the relationship between thicknesses of a Mg layer during film formation and MR change rates in Example 3.

Referring now to FIG. 6, Example 3 will be described. FIG. 6 is a graph showing the relationship between thicknesses of the Mg layer $13_3$ during film formation and MR change rates (ΔR/R).

First, samples that were the same as the MR film 10A of Example 1 shown in FIG. 2, except that the thickness of the Mg layer $13_3$ was varied from 0 nm to 1.5 nm, were manufactured. The thickness of each oxide layer $13_2$ was adjusted so that the areal resistance RA of each MR film 10A became approximately 1 $\Omega\mu m^2$, and these samples were subjected to a heat treatment at two temperatures of 290° C. and 380° C.

As can be seen from FIG. 6, where Mg does not exist, the MR change rate ($\Delta R/R$) is approximately 10% at any heat treatment temperature. Where the thickness of the Mg layer $13_3$ is 0.3 nm or greater, the effect of a heat treatment to increase the MR change rate was observed. For example, where the heat treatment temperature Tan is 380° C., the MR change rate is higher than in a case where Mg does not exist even if the thickness of the Mg layer is approximately 1.5 nm. To achieve a high MR change rate or an MR change rate of 30% or higher, the thickness of the Mg layer $13_3$ is preferably between 0.3 nm and 1 nm.

As Comparative Examples 1, 2, 3, and 4, samples that were the same as Example 1 shown in FIG. 2, except that the layer $13_3$ was made of some other material, such as at least one element selected from the group consisting of Si, Cu, and Al, were manufactured. These samples were subjected to a heat treatment at two temperatures Tan of 290° C. and 380° C. FIG. 7 shows the results of measurement of $\Delta R/R$ (%) in those samples.

In Comparative Example 1, a 0.5-nm thick Si layer was used as the layer $13_3$. In Comparative Example 2, a stack structure formed with a 0.3-nm thick Al layer and a 0.5-nm thick Cu layer stacked on the Al layer was used as the layer $13_3$. In the Comparative Example 3, a stack structure formed with a 0.3-nm thick Al layer and a 0.5-nm thick Si layer stacked on the Al layer was used as the layer $13_3$. In Comparative Example 4, a stack structure formed by stacking a 0.3-nm thick Al layer, a 0.5-nm thick Si layer, and a 0.3-nm thick Cu layer in this order was used as the layer $13_3$. In the MR film of Example 3, a stack structure formed with a 0.3-nm thick Al layer and a 0.5-nm thick Mg layer stacked on the Al layer was used as the layer $13_3$.

Where the MR films of Comparative Examples 1, 2, 3, and 4 were subjected to a heat treatment at 290° C., $\Delta R/R$ was 7%, 11%, 10%, and 8%. Where the MR films of Comparative Examples 1, 2, 3, and 4 were subjected to a heat treatment at 380° C., $\Delta R/R$ was 15%, 9%, 25%, and 26%. On the other hand, where the MR film of Example 3 was subjected to a heat treatment at 290° C., $\Delta R/R$ was 16%. Where the MR film of Example 3 was subjected to a heat treatment at 380° C., $\Delta R/R$ was 36%.

While $\Delta R/R$ in Example 3 was 36% at the heat treatment temperature of 380° C., $\Delta R/R$ in Comparative Examples 1 through 4 without Mg was 26% at a maximum. According to JP-A 2009-10333 (KOKAI), JP-A 2012-15489 (KOKAI), and U.S. Pat. No. 9,047,891, $\Delta R/R$ is lower than 30%, even if the uppermost layer of the intermediate layer is a Zn layer. It is apparent from these facts that the layer $13_3$ containing Mg has the effect to make the MR change rate higher than those in the cases where other materials are used.

Example 4

Figure 8A:
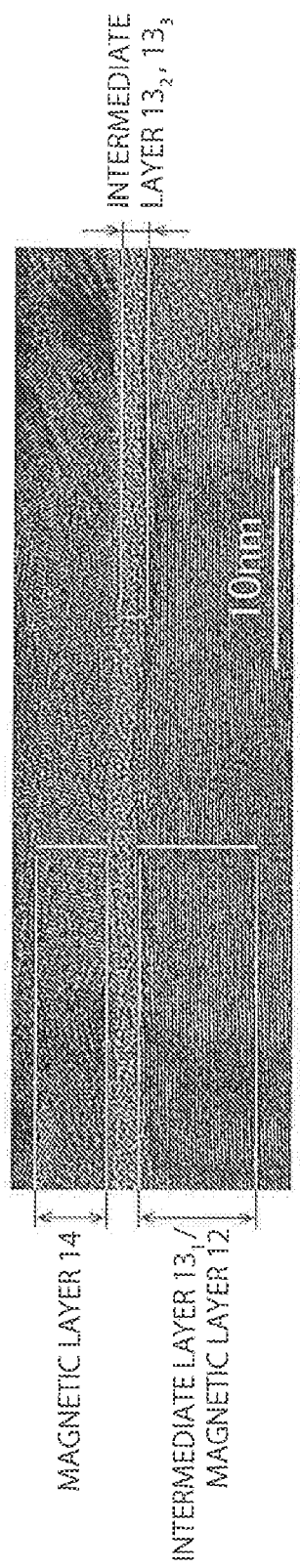
FIG. 8A is a photograph of a cross-section of an MR film of Example 4 taken with a TEM.
Figure 8B:
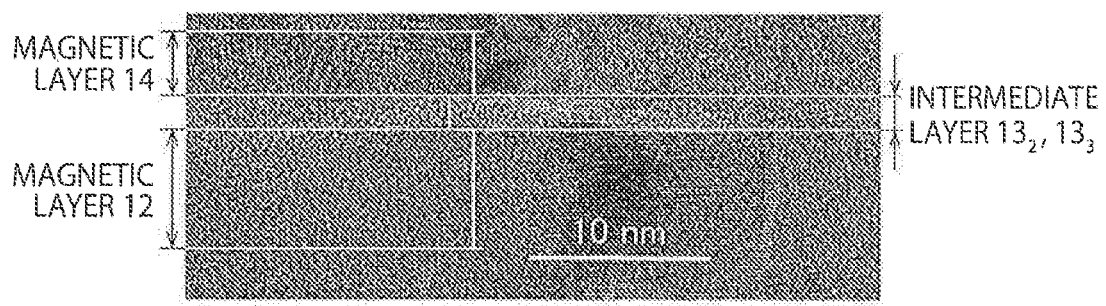
FIG. 8B is a photograph of a cross-section of an MR film of Comparative Example B taken with a TEM.
Figure 8C:
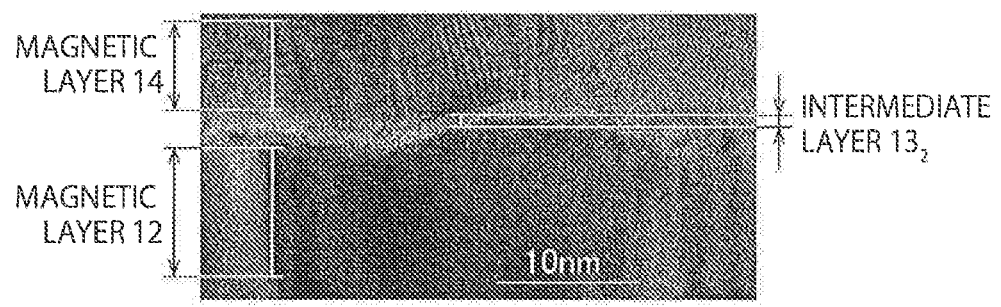
FIG. 8C is a photograph of a cross-section of an MR film of Comparative Example C taken with a TEM.

As Example 4, an MR film that was the same as the MR film 10A of Example 1 shown in FIG. 2, except that the intermediate layer 13 is formed with a metal layer $13_1$, an oxide layer $13_2$, and a Mg layer $13_3$, was manufactured. This MR film is the MR film of Example 4. Also, a sample of Comparative Example B having an intermediate layer 13 including an oxide layer $13_2$ and a Mg layer $13_3$ but not including a metal layer $13_1$, and a sample of Comparative Example C having an intermediate layer 13 including an oxide layer $13_2$ but not including a metal layer $13_1$ and a Mg layer $13_3$ were manufactured. FIGS. 8A, 8B, and 8C show photographs of cross-sections of Example 4, Comparative Example B, and Comparative Example C taken with a TEM (Transmission Electron Microscope).

The thicknesses of the respective oxide layers (an oxide layer $13_2$ and stack films formed with an oxide layer $13_2$ and a Mg layer $13_3$ in FIGS. 8A through 8C) are approximately 1 nm. However, these oxide layers greatly vary in evenness and smoothness. The evenness and the smoothness in Comparative Example B are higher than in Comparative Example C, and the evenness and the smoothness in Example 4 are higher than in Comparative Example B.

It is widely known that flat interfaces are essential factors in achieving a high MR change rate in a tunneling MR element or a CPP-GMR (Current Perpendicular to Plane-Giant Magneto Resistance) element. It is apparent that the high MR change rate in the interfaces were achieved through the improvement of the smoothness and the evenness of the oxide layer by virtue of the metal layer $13_1$ and the Mg layer $13_3$ in Example 4.

Example 5

Figure 9:
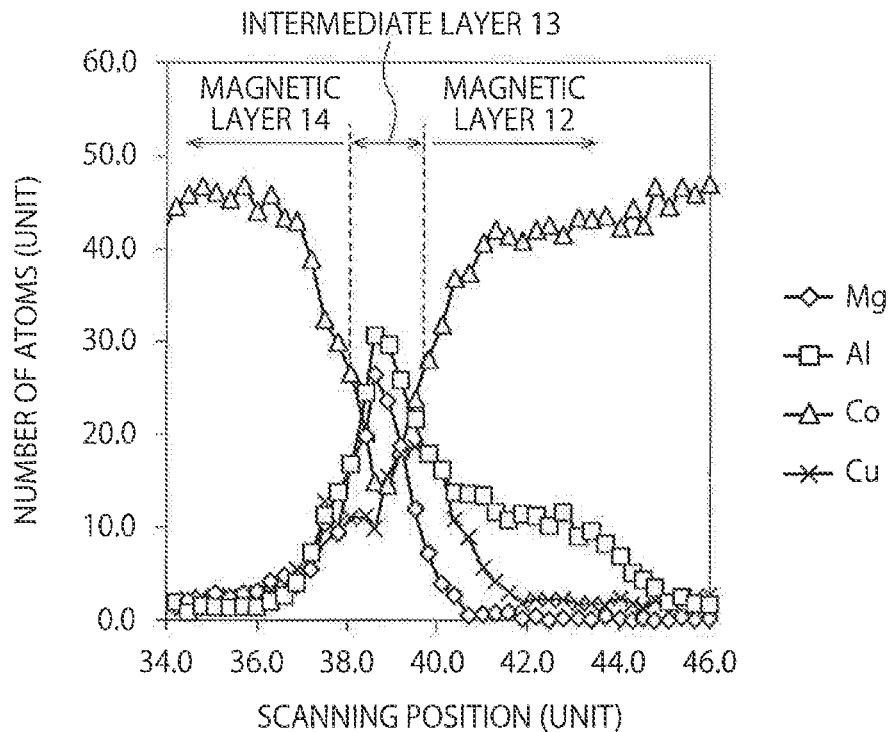
FIG. 9 is a graph showing the results of composition analysis conducted on an MR film of Example 5.

Further, the MR film of Example 4 was scanned in its thickness direction with an electron beam of approximately 1 nm in diameter, and composition analysis was conducted by EDX (Energy Dispersive X-ray Spectrometry). FIG. 9 shows the results of the composition analysis.

As can be seen from FIG. 9, the numbers of atoms of elements indicated by the ordinate axis show the relative values and the distribution information with respect to the respective elements, since sensitivity coefficients vary among the elements, and it is difficult to compare absolute values with one another. The region where the number of Co atoms in the magnetic layers 12 and 14 is smaller indicates the region of the intermediate layer 13 (approximately 1 nm in thickness). With a resolution of 1 nm, apparent Co atoms are counted in the intermediate layer 13, but there is a possibility that Co has entered the intermediate layer 13. The peak of the number of Al atoms is almost the same as the position where the number of Co atoms is smallest. Since the portion of the magnetic layer 12 on the side of the intermediate layer 13 is formed with a FeCoAl alloy, Al is detected. The number of Mg atoms is the same as the number of Al atoms in the interface between the magnetic layer 14 and the intermediate layer 13, and it is apparent that Mg exists in the interface. In the intermediate layer 13, there is not a clear difference between the Mg distribution and the Al distribution due to insufficient analysis and breakdown. However, in view of the film configuration shown in FIG. 1, the number of Mg atoms should be smaller at the center of the intermediate layer 13 at which the peak of the number of Al atoms exists. Unlike the peak of the number of Al atoms, the peak of the number of Cu atoms exists on the side of the magnetic layer 12, and coincides with the position of the metal layer $13_1$ in the film configuration shown in FIG. 1. Further, the number of Cu atoms gradually decreases toward the magnetic layer 14, and a small sub peak exists in the interface between the magnetic layer 14 and the intermediate layer 13. In view of this, it is apparent that Cu has entered the oxide layer $13_2$.

Example 6

Figure 10:
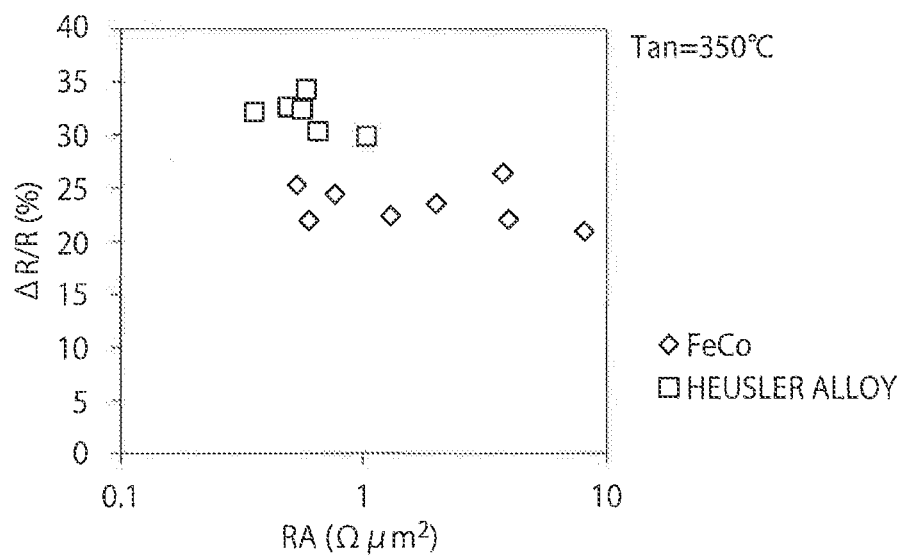
FIG. 10 is a graph showing the relationship between MR change rates and areal resistances in the MR film of Example 6.

Referring now to FIG. 10, an MR film according to Example 6 will be described. This MR film of Example 6 is the same as the MR film 10A of Example 1 shown in FIG. 2, except that a Heusler ordered alloy for achieving high spin polarization, such as a CoFeMnGe alloy, is used as the magnetic layer 14. FIG. 10 shows the relationship between the MR change rate ΔR/R and the areal resistance RA in the MR film of Example 6.

The CoFeMnGe alloy used as the magnetic layer 14 of the MR film of Example 6 has the following composition: 47 at % of Co, 13 at % of Fe, 15 at % of Mn, and 25 at % of Ge. FIG. 10 also shows the relationship between the MR change rate ΔR/R and the areal resistance RA in an MR film containing a FeCo alloy as the magnetic layer 14. Both samples were subjected to a heat treatment at 350° C.

As a result of ultramicroscopic diffraction figure analysis with a TEM carried out on these samples, an $L2_1$ ordered phase was observed when the heat treatment temperature Tan was 350° C. or higher. This ordered phase is known to exhibit excellent spin polarization attributable to a half metal. Since Ge might diffuse at a higher temperature than that, the heat treatment temperature is set at 350° C.

As can be seen from FIG. 10, ΔR/R in the FeCo alloy was approximately 25% when the areal resistance RA was in the neighborhood of 0.5 $\Omega\mu m^2$. In Example 6 using a CoFeMnGe alloy as the magnetic layer 14, on the other hand, ΔR/R was approximately 33%.

Example 7

Figures 11, 12, 13:
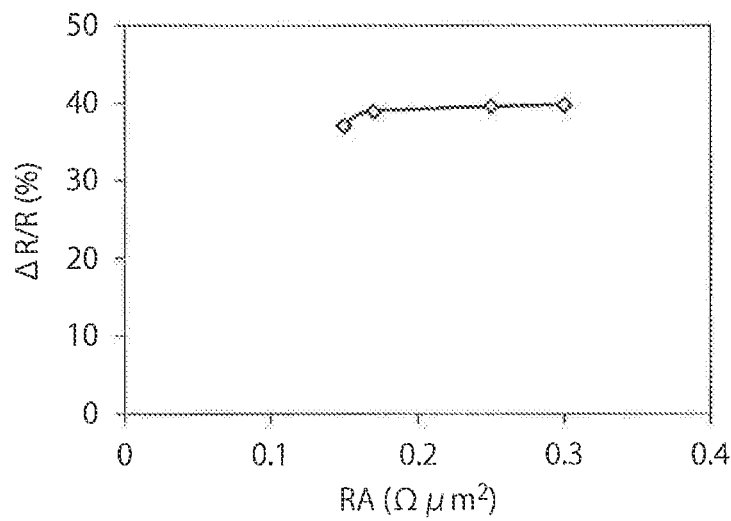
FIG. 11 is a table showing the results of measurement of MR change rates of MR films of Example 7.
FIG. 12 is a table showing MR change rates of MR films of Example 8.
FIG. 13 is a graph showing the relationship between MR change rates and areal resistances in the MR film of Example 10.

FIG. 11 shows the results of measurement of the MR change rates ΔR/R in MR films of Example 7 using other materials for the magnetic layer 14. As can be seen from FIG. 11, in a case where a CoFeMnSi alloy having the same ordered structure as a CoFeMnGe alloy was used, or where a FeCo alloy was inserted into the interface with the intermediate layer, the effect to increase the MR change rate (ΔR/R) was not as great as that in a case where a FeCo alloy was used as the magnetic layer 14. Where a FeCoGe alloy exhibiting a B2 ordered layer exists directly in the interface, a high MR change rate ΔR/R of approximately 30% is obtained.

In view of the above, existence of the Ge element in the interface between the intermediate layer 13 and the magnetic layer 14, or a Ge alloy having a B2 or $L2_1$ ordered phase is important in increasing the MR change rate. Specifically, to achieve a high MR change rate, it is preferable to form a FeCoGe alloy or a CoFeMnGe alloy having Fe substituted by Mn in contact with the intermediate layer 13.

Example 8

In Example 3 described above, a stack structure formed with a 0.5-nm thick Mg layer and a 1-nm thick Al layer stacked on the Mg layer was oxidized to form the layer $13_2$ serving as the intermediate layer. FIG. 12 shows the results of measurement of MR change rates ΔR/R in other structures. Heat treatments were conducted at the two temperatures Tan of 290° C. and 380° C. In FIG. 12, the numerals in the parentheses indicate the thicknesses (nm) of layers. For example, "Mg(0.3)/Al(1)" indicates a stack structure formed with a 0.3-nm thick Mg layer and a 1-nm thick Al layer stacked on the Mg layer.

As can be seen from FIG. 12, to achieve a high MR change rate, a stack structure formed with Mg and Al is preferable to Al and a stack structure formed with Si and Al. The highest MR change rate is achieved when the thickness of the Mg layer is 0.5 nm.

Example 9

As Example 9, another method of manufacturing the intermediate layer 13 will be described. By this manufacturing method, the intermediate layer 13 is formed on the magnetic layer 12 through the procedures described below.

(1) The metal layer $13_1$ is formed by sputtering. For example, a film having a thickness of 0.25 to 1.5 nm is made of at least one metal selected from the group consisting of Cu, Ag, and Au.

(2) The metal layer for forming the oxide layer $13_2$ is formed by sputtering. For example, a 0.5-nm thick Mg layer is formed by sputtering, and a 1-nm thick Al layer is stacked on the Mg layer by sputtering (up to 1 nm). Alternatively, an AlMg alloy may be formed by sputtering.

Also, an Al layer and a Mg layer may be simultaneously formed by sputtering.

(3) The surface of the metal layer containing Al is oxidized by plasma oxidation or ion assisted oxidation. The oxidation is preferably conducted in an oxidation chamber separated from the sputtering film formation chamber. That is, the oxidation is conducted through ion beam irradiation in oxygen plasma or in an oxygen gas atmosphere.

The ion assisted oxidation is an oxidation technique to be used in a current-constricting structure that emits Ar ions in an oxygen atmosphere with a low acceleration voltage (<100 V), and forms a Cu metal path in an Al oxide (see the reference (H. Fukuzawa, et al.: J. Phys. D, Appl. Phys. 40, 1213 (2007)), for example).

In this example, Mg layers are formed as the uppermost layer and the lowermost layer of the oxide layer $13_2$, and both of the Mg layers are evenly oxidized. As a result, an even and continuous intermediate layer (NOL) as shown in FIG. 8A can be achieved. This intermediate layer is entirely different from the current-constricting structure shown in FIG. 8C.

(4) Ion beam etching is conducted on the oxide layer, to adjust the thickness of the oxide layer. Ar ions are emitted for 100 seconds with a low acceleration voltage (approximately 100 V) as in the ion assisted oxidation. In this manner, etching is conducted on the surface of the oxide layer. This etching may be conducted by irradiating the surface of the oxide layer with plasma. As a result, the thickness becomes approximately 1.2 nm, and the areal resistance RA becomes approximately 2 $\Omega\mu m^2$. If the etching is conducted for 130 seconds, the thickness becomes approximately 0.9 nm, and the areal resistance RA becomes approximately 0.3 $\Omega\mu m^2$. If the Al layer during film formation is made thinner, and a low areal resistance RA is achieved without ion etching, unevenness appears, and the areal resistance RA varies. As a thick oxide layer is first formed, and etching is then conducted on the oxide layer, a smooth surface is obtained, and the areal resistance RA can be controlled with higher precision.

(5) A metal Mg layer is formed while the substrate is heated. The upper limit of the temperature is preferably 300° C. This is to prevent characteristics degradation due to unevenness in the MR film caused by crystal growth of the lower shield layer 21. If necessary, a small amount of oxygen may be added to the Mg layer.

After that, the magnetic layer 14 and the cap layer 15 are formed.

Through the above procedures, Mg oxidation becomes easier than in a case where a heat treatment is performed after the element film formation, and it becomes possible to lower the heat treatment temperature necessary for increasing the MR change rate. A high-temperature heat treatment is not necessary in the film formation for the layers to be formed after the formation of the intermediate layer 13. For example, in a case where magnetostriction is reduced with the intermediate layer 13 as a film stacked on NiFe, the problem of a lowered MR change rate can be avoided by virtue of mutual diffusion with a CoFeMnGe layer. Instead of the substrate heating in the procedure (5), a heat treatment may be performed in a vacuum film forming device immediately after the formation of the metal Mg layer and immediately before the formation of the magnetic layer 14.

Example 10

A sample of a magnetoresistive element was manufactured by changing the magnetic layer size to approximately 0.15 μm in the structure of the MR film of Example 6 shown in FIG. 10, which can achieve the highest MR change rate through a heat treatment at a relatively low temperature, such as 350° C. With respect to this magnetoresistive element, MR characteristics in which the areal resistance RA was lower than 0.3 $\Omega\mu m^2$, which is difficult to measure by CIPT, were examined. A CoFeMnGe layer was used as the magnetic layer 14 of this magnetoresistive element.

As in JP-A 2009-10333 (KOKAI), JP-A 2012-15489 (KOKAI), and U.S. Pat. No. 9,047,891, the electrode resistance was adjusted to 50 m$\Omega\mu m^2$, and the MR change rate ($\Delta R/R$) and the areal resistance RA were calculated. The heat treatment temperature was set at 350° C. The results are shown in FIG. 13. As can be seen from FIG. 13, where the areal resistance RA was between 0.1 $\Omega\mu m^2$ and 0.3 $\Omega\mu m^2$, an MR change rate $\Delta R/R$ of 35% to 40%, which is equal to or higher than that in Example 6 shown in FIG. 10, was obtained. This proves that a much higher MR change rate $\Delta R/R$ can be achieved, compared with the highest MR change rate of 30% in JP-A 2009-10333 (KOKAI), JP-A 2012-15489 (KOKAI), and U.S. Pat. No. 9,047,891.

Figure 14A:
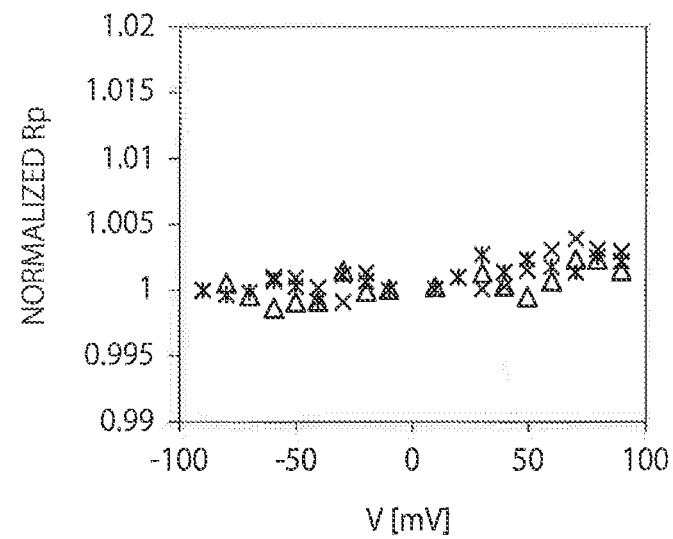
FIG. 14A is a graph showing the relationship between voltage Vb and resistance Rp of a magnetoresistive element according to Example 10.

The relationship between the voltage Vb and the resistance Rp in this magnetoresistive element according to Example 10 was further examined. The results are shown in FIG. 14A. Here, the resistance Rp is the resistance to be observed in a case where the magnetization direction of the magnetic layer 12 and the magnetization direction of the magnetic layer 14 are the same, or the magnetic layer 12 and the magnetic layer 14 are arranged to have the same magnetization direction.

As can be seen from FIG. 14A, the resistance Rp remained substantially constant, even though the voltage Vb was increased to almost 100 mV.

Figure 14B:
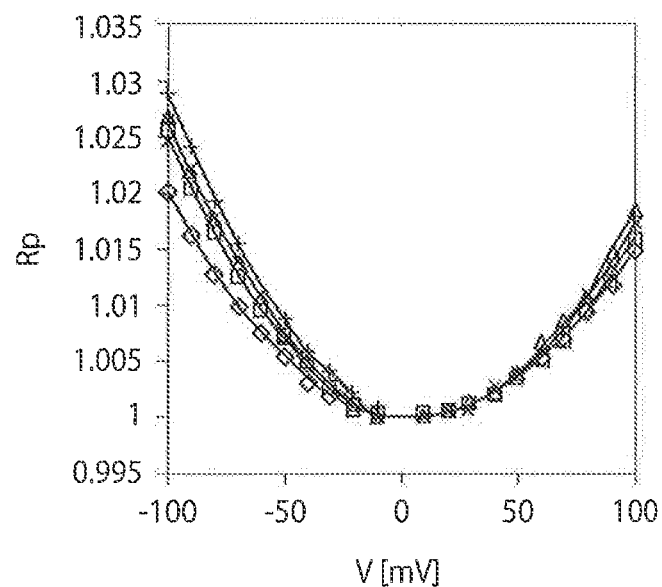
FIG. 14B is a graph showing the relationship between voltage Vb and resistance Rp of a magnetoresistive element according to Comparative Example.

As a comparative example, a current-constructing MR element having a Cu current-constricting path in an alumina oxide layer was manufactured. FIG. 14B shows the results of measurement of the voltage characteristics of the MR element. The element of this comparative example has a structure disclosed in the reference (H. Fukuzawa, et al.: J. Phys. D, Appl. Phys. 40, 1213 (2007)). As can be seen from FIG. 14B, in the current-constricting element, the resistance Rp clearly increased in a parabolic manner due to heat generation, since the current concentrates in the very narrow current-constricting path.

In the intermediate layer of Example 6, on the other hand, Cu is evenly distributed, and current evenly flows in the intermediate layer. This means that any increase in the resistance Rp due to heat generation was not observed. Alternatively, this means that, by virtue of oxide conduction, the possibility of an increase in resistance due to temperature is very low. This is a different aspect from a metal. In either of the cases, this magnetoresistive effect has a different mechanism from that of a current-constricting type that achieves a high MR change rate as current concentrates in the Cu metal constricting portion.

As described above, the first embodiment and the respective examples can provide a magnetoresistive element that has a low areal resistance RA and is capable of achieving a high output and a high S/N ratio, and a method of manufacturing the magnetoresistive element.

Second Embodiment

Figure 15:
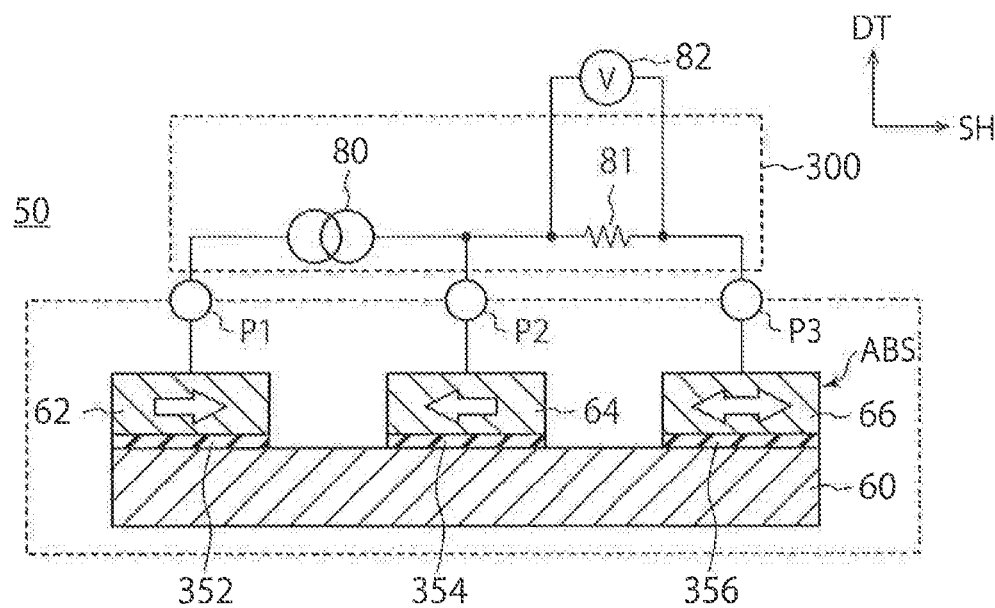
FIG. 15 is a diagram for explaining a magnetic head according to a second embodiment.

FIG. 15 shows a magnetic head (a hard disk head) according to a second embodiment. This magnetic head of the second embodiment includes a three-terminal nonlocal spin valve element 50. This three-terminal nonlocal spin valve element 50 includes a nonmagnetic base layer (a nonmagnetic base electrode) 60, a spin injection terminal 62, a common terminal 64, and a spin detection terminal 66. The spin injection terminal 62, the common terminal 64, and the spin detection terminal 66 are disposed in the extending direction of the nonmagnetic base layer 60, are arranged at intervals on the nonmagnetic base layer 60, and each include a magnetic layer. In this embodiment, the common terminal 64 is located between the spin injection terminal 62 and the spin detection terminal 66. The spin injection terminal 62, the common terminal 64, and the spin detection terminal 66 are disposed on the same surface of the nonmagnetic base layer 60.

The spin injection terminal 62 and the common terminal 64 are at a much shorter distance from each other than the spin relaxation length λn of the nonmagnetic base layer 60. High-resistance interfacial layers 352, 354, and 356 are inserted into the interfaces between the nonmagnetic base layer 60 and the respective magnetic terminal layers. The spin injection terminal 62 includes a magnetic layer having a pinned magnetization direction. The common terminal 64 includes a magnetic layer (a pinned layer) having a pinned magnetization direction, and the magnetization direction of this magnetic layer is antiparallel to the magnetization direction of the magnetic layer of the spin injection terminal 62. The spin detection terminal 66 includes a magnetic layer (a free layer) having a variable magnetization direction. Here, a variable magnetization direction is a magnetization direction that varies with external magnetic fields.

The magnetic layers of the spin injection terminal 62 and the common terminal 64 are connected to external lead terminals P1 and P2 of the slider of the magnetic head (hard disk head) described later, and these external lead terminals P1 and P2 are connected to a current source 80 of a preamplifier 300, so that sense current is introduced thereto. The magnetic layer of the spin detection terminal 66 is connected to an external lead terminal P3 of the slider. The external lead terminal P3 of the spin detection terminal 66 and the external lead terminal P2 of the common terminal 64 are connected to a resistor 81 of the preamplifier 300, and the voltage between the external lead terminals P2 and P3 is measured with a voltmeter 82.

That is, the non local spin valve element 50 of this embodiment has a three-terminal structure in which the terminal 64 is shared by the preamplifier 300. The preamplifier 300 includes the current source 80 and the resistor 81. In FIG. 15, the ABS (Air Bearing Surface) is the surface facing the magnetic recording medium in a case where the three-terminal nonfocal spin valve element 50 of this embodiment is used as the magnetic sensor of the magnetic head. DT (Down Track) indicates the moving direction of the magnetic recording medium, and SH (Stripe Height) indicates the direction toward the magnetic recording medium.

Sense current is applied to the nonmagnetic base electrode 60 through the spin injection terminal 62 and the common terminal 64. Current flows in through the magnetic layer of one of these two terminals, and current flows out through the magnetic layer of the other one of the two terminals. Here, the electrical resistance in the magnetic layers varies between majority spin electrons and minority spin electrons, and therefore, a spin-polarized current flows into the nonmagnetic base electrode 60. The value of the electrochemical potential of the conduction electrons in the nonmagnetic base electrode 60 varies between up-spin electrons and down-spin electrons.

Figure 16:
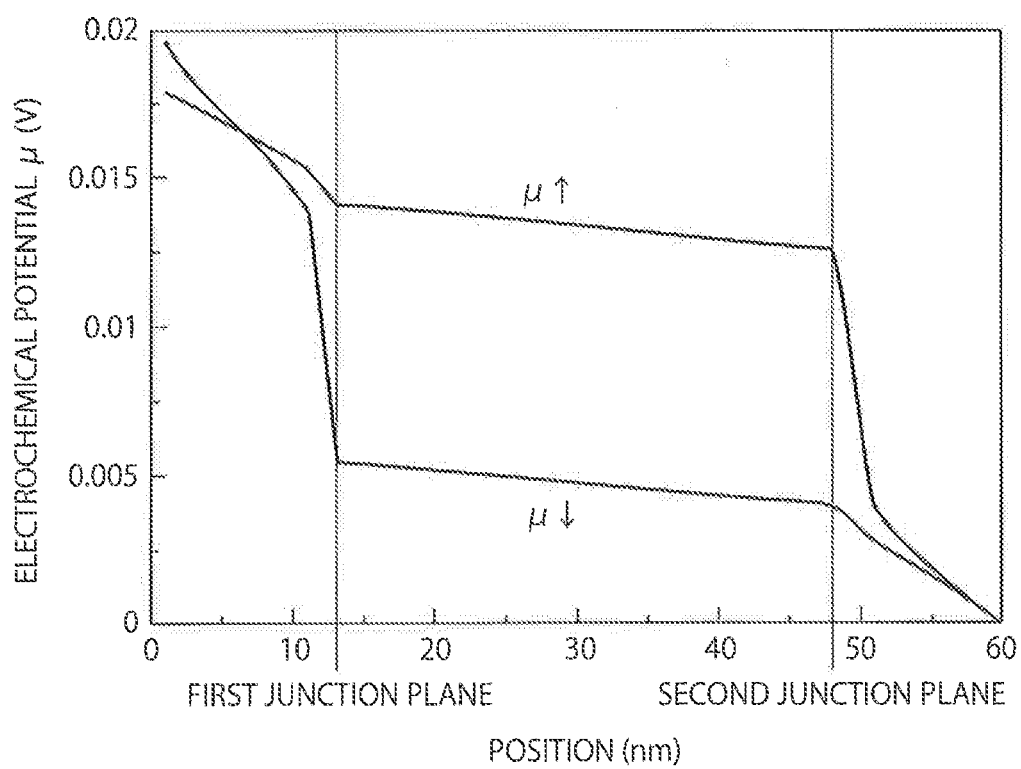
FIG. 16 is an example of a graph in which the electrochemical potentials of up-spin electrons and down-spin electrons are plotted in the second embodiment.

FIG. 16 shows an example of a graph in which the electrochemical potentials $\mu\uparrow$ and $\mu\downarrow$ of up-spin electrons and down-spin electrons are plotted along the path of the injected sense current. In this example, the magnetic layer of the common terminal 64 is set at 0 V, and the magnetic layer of the spin injection terminal 62 is set at a positive voltage. The sense current path shown in FIG. 16 extends from the upper surface of the spin injection terminal 62 (the surface connecting to the external lead terminal P1) to the upper surface of the common terminal 64 (the surface connecting to the external lead terminal P2) through the spin injection terminal 62, a first junction plane joining the spin injection terminal 62 and the nonmagnetic base electrode 60, the nonmagnetic base electrode 60, a second junction plane joining the nonmagnetic base electrode 60 and the common terminal 64, and the common terminal 64. With this, an up-spin current $I\uparrow$ and a down-spin current $I\downarrow$ flow from the spin injection terminal 62 to the nonmagnetic base electrode 60, and then flow from the nonmagnetic base electrode 60 to the common terminal 64.

In this embodiment, the magnetization direction of the magnetic layer of the spin injection terminal 62 and the magnetization direction of the magnetic layer of the common terminal 64 are antiparallel to each other. Therefore, spin accumulation that increases the up-spin current $\mu\uparrow$ occurs both in the first junction plane between the spin injection terminal 62 and the nonmagnetic base electrode 60, and in the second junction plane between the common terminal 64 and the nonmagnetic base electrode 60.

Since the spin injection terminal 62 and the common terminal 64 are at a sufficiently shorter distance from each other than the spin relaxation length $\lambda n$ of the nonmagnetic base electrode 60, the spin accumulation in the portion of the nonmagnetic base electrode 60 located between the first junction plane and the second junction plane is substantially even and is large at any site in the nonmagnetic base electrode 60.

In this embodiment, the short spin diffusion length of a magnetic material is utilized, so that the electrochemical potential $\mu\uparrow$ of up-spin electrons and the electrochemical potential $\mu\downarrow$ of down-spin electrons can be separated from each other at a short distance in the magnetic material. Consequently, the spin relaxation length $\lambda n$ necessary in connecting an external lead terminal directly to the nonmagnetic base electrode in conventional cases becomes unnecessary, and the nonmagnetic base electrode 60 can be shortened accordingly.

Figure 17:
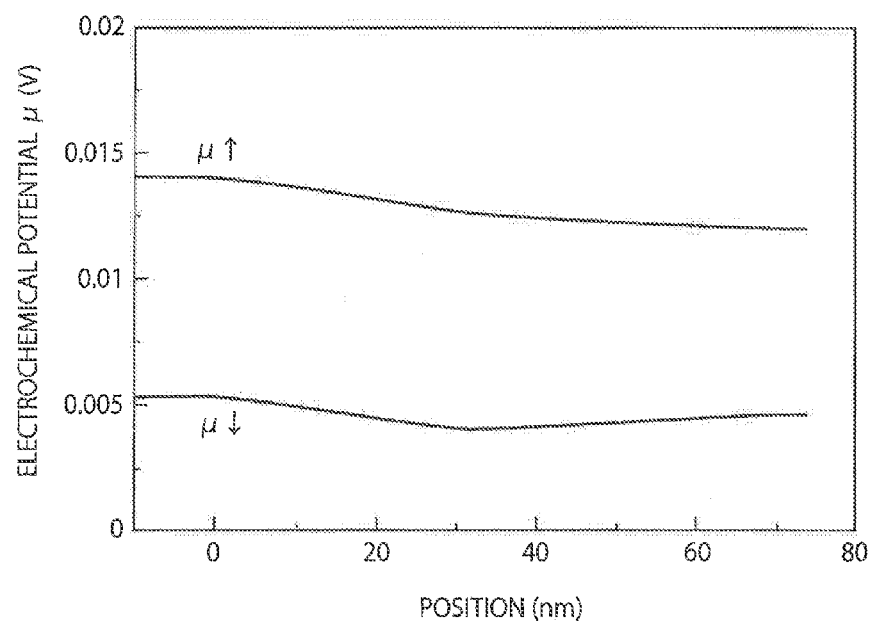
FIG. 17 is a graph showing an electrochemical potential distribution along the center of a nonmagnetic base electrode in the second embodiment.

FIG. 17 shows the electrochemical potential distribution along the center of the nonmagnetic base electrode 60.

As can be seen from FIG. 17, in this embodiment, the nonmagnetic base electrode 60 can be made much shorter than the spin relaxation length $\lambda n$. Thus, the spin accumulation does not have a large distribution in the entire nonmagnetic base electrode 60, and large spin accumulation occurs almost evenly in the nonmagnetic base electrode 60.

Although the spin detection terminal 66 is electrically in contact with the nonmagnetic base layer 60, the spin relaxation length $\lambda f$ in the magnetic material is normally very small, such as several nanometers to 10 nm. Therefore, the up-spin electrons and the down-spin electrons are in a short-circuited state in the magnetic material. That is, in a case where the electrochemical potential in the nonmagnetic base electrode 60 has the distribution shown in FIG. 17, down-spin electrons flow into the spin detection terminal 66, and up-spin electrons flow out of the spin detection terminal 66. At this point, the majority carrier resistivity $\rho^+$ and the minority carrier resistivity $\rho^-$ of the spin detection terminal 66 have different values. Therefore, the voltage at which the electrochemical potential relaxes in the spin detection terminal 66 varies depending on whether the magnetization directions of the magnetic layers of the spin injection terminal 62 and the spin detection terminal 66 are parallel or antiparallel.

Figures 18A, 18B:
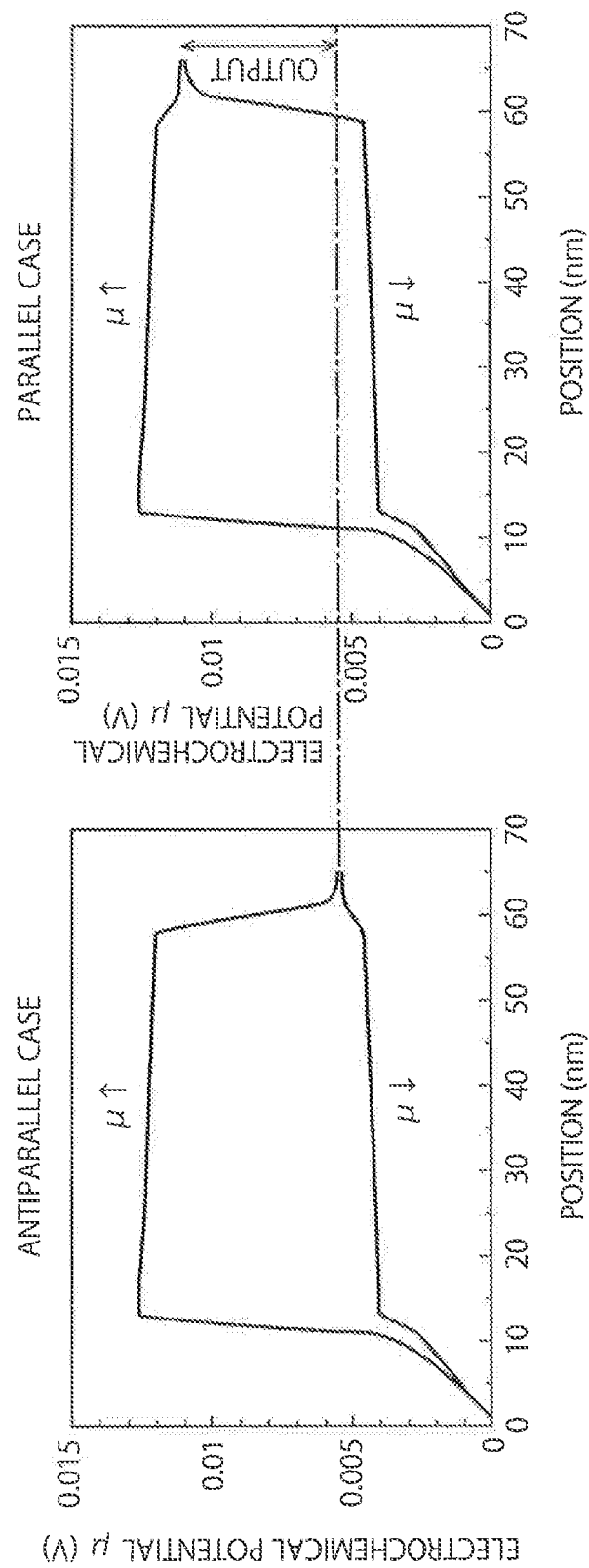
FIG. 18A is a graph showing an example of an electrochemical potential distribution along the path from a common terminal to a spin detection terminal.
FIG. 18B is a graph showing an example of an electrochemical potential distribution along the path from the common terminal to the spin detection terminal.

FIGS. 18A and 18B show examples of electrochemical potential distributions along the path from the common terminal 64 to the nonmagnetic base electrode 60 to the spin detection terminal 66 in a case where the two magnetization directions are antiparallel and in a case where the two magnetization directions are parallel. In the case of parallel magnetization directions, the electrochemical potential relaxes at high voltage. In the case of antiparallel magnetization directions, the electrochemical potential relaxes at low voltage. In view of this, the voltage is measured to determine whether the two magnetization directions are parallel or antiparallel.

In a case where the angle between the magnetization directions of the magnetic layers of the spin injection terminal 62 and the spin detection terminal 65 is an angle $\theta$, the potential difference is expressed as $$V=(Vp+Vap)/2-Vs/2\cdot\cos\theta,$$

where Vp represents the potential difference in the case where the magnetization directions are parallel, Vap represents the potential difference in the case where the magnetization directions are antiparallel, and "Vap−Vp=Vs" represents the difference between Vp and Vap.

In view of this, the potential difference is measured, so that the relative angle between the magnetization directions of the magnetic layers of the spin injection terminal 62 and the spin detection terminal 66 can be measured. Thus, the three-terminal nonlocal spin valve element 50 of this embodiment can be used as a magnetic field sensor, such as a hard disk head.

In the nonmagnetic base electrode 60, the spin relaxation length $\lambda n$ is preferably as long as possible, to cause larger spin accumulation and achieve a larger output. In view of this, a material having a great spin relaxation length, such as Cu, Ag, Au, Al, or Mg is preferably used as the nonmagnetic base electrode 60.

The interfacial layers each have the same structure as the CPP-SV described in the first embodiment and Examples thereof, or a structure formed by stacking a Mg layer on an oxide layer having a nonmagnetic base electrode material mixed therein. In a spin accumulation element, the nonmagnetic base layer also serves as a metal layer that is located immediately below the oxide layer and is formed with a metal selected from the group consisting of Cu, Ag, and Au.

The materials of the respective magnetic layers of the spin injection terminal 62, the common terminal 64, and the spin detection terminal 66 are preferably a Ge-containing alloy, FeCoGe, and a CoMnGe alloy, as in a CPP-SV (Current Perpendicular to Plane-Spin Valve) element. Particularly, with a CoFeMnGe alloy, a Heusler ordered layer can be easily formed through a low-temperature heat treatment, and a high spin polarization rate and a high spin injection efficiency in an interface can be achieved.

The magnetization pinning in the magnetic layers of the spin injection terminal 62 and the common terminal 64 can be performed by stacking an antiferromagnetic layer directly on each of the magnetic layers and providing a unidirectional anisotropy thereto. PtMn, IrMn, or the like can be used as the material of such an antiferromagnetic layer. Each of the magnetic layers having a pinned magnetization direction may have a so-called synthetic structure in which a material is interposed between the upper and lower magnetic materials so that the upper and lower magnetic materials are antiferromagnetically coupled to each other, as in CoFe/Ru/CoFe. With a synthetic structure, the magnetization pinning can be more firmly performed.

Figure 19:
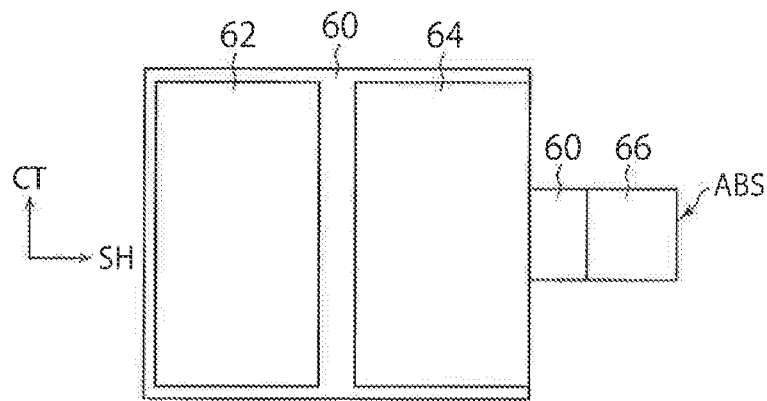
FIG. 19 is a diagram showing the shapes of the magnetic layers in the magnetic head of the second embodiment.

FIG. 19 shows the shapes of the magnetic layers of the nonmagnetic base layer 60, the spin injection terminal 62, the common terminal 64, and the spin detection terminal 66 in the three-terminal nonlocal spin valve element 50 shown in FIG. 15, seen from a plane perpendicular to the ABS and to the moving direction of the magnetic recording medium, or from the plane (CT (Cross Track) direction×SH direction).

As shown in FIG. 19, the spin injection terminal 62 and the common terminal 64 are arranged in parallel in the SH direction, and are made to have larger sizes than the spin detection terminal 66 in the CT direction, so that the junction planes of the terminals 62 and 64 are made wider than the junction plane of the terminal 66 in the CT direction. Thus, a structure in which the junction areas of the terminals 62 and 64 are larger can be achieved.

Figure 20:
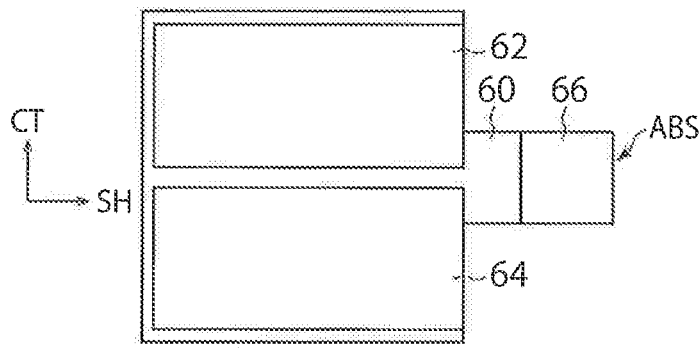
FIG. 20 is a diagram showing the shapes of the magnetic layers in a first modification of the second embodiment.

As shown in FIG. 20, the spin injection terminal 62 and the common terminal 64 may be arranged in the CT direction, and be made to have larger sizes than the spin detection terminal 66 in the SH direction, so that the junction areas of the spin injection terminal 62 and the common terminal 64 can be increased.

Figure 21:
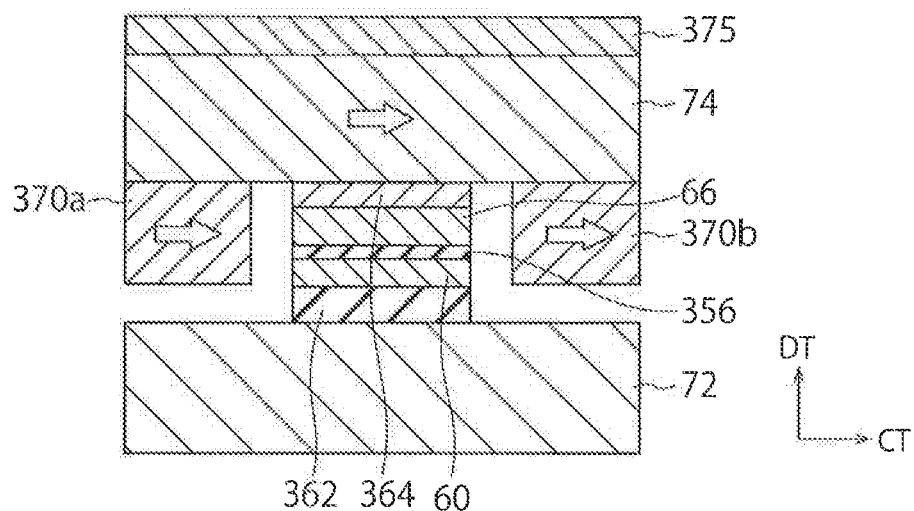
FIG. 21 is a diagram showing a three-terminal nonlocal spin valve element of the second embodiment, seen from the ABS.

FIG. 21 is a diagram showing the three-terminal nonlocal spin valve element 50 shown in FIG. 15, seen from the ABS;

The three-terminal nonlocal spin valve element 50 is disposed between shields 72 and 74, and the nonmagnetic base layer 60 and the spin detection terminal 66 serving as a free layer, as well as a base layer 362 and a cap layer 364, are interposed between the shields 72 and 74. The spin injection terminal 62 and the common terminal 64, which serve as pinned layers, do not exist on the ABS side. Thus, the gap between the shields can be narrowed for higher-resolution reproduction.

In a CPP-SV element, only the top-side interface of the interfaces between the intermediate layer and the two magnetic layers can be a smooth interface between a MgO oxide layer and a Ge-containing magnetic layer, and large interfacial spin polarization and a large interfacial magnetoresistive effect can be achieved. In the bottom-side interface, however, it is difficult to achieve a structure of the present invention as in the top-side interface. In a spin accumulation element, on the other hand, all the magnetic interfaces are located on the top side by virtue of the structure shown in FIG. 15. Thus, large interfacial spin polarization can be achieved, and a greater effect to increase outputs than that of a CPP-SV element can be expected from the interfacial layers of this embodiment.

Figure 22:
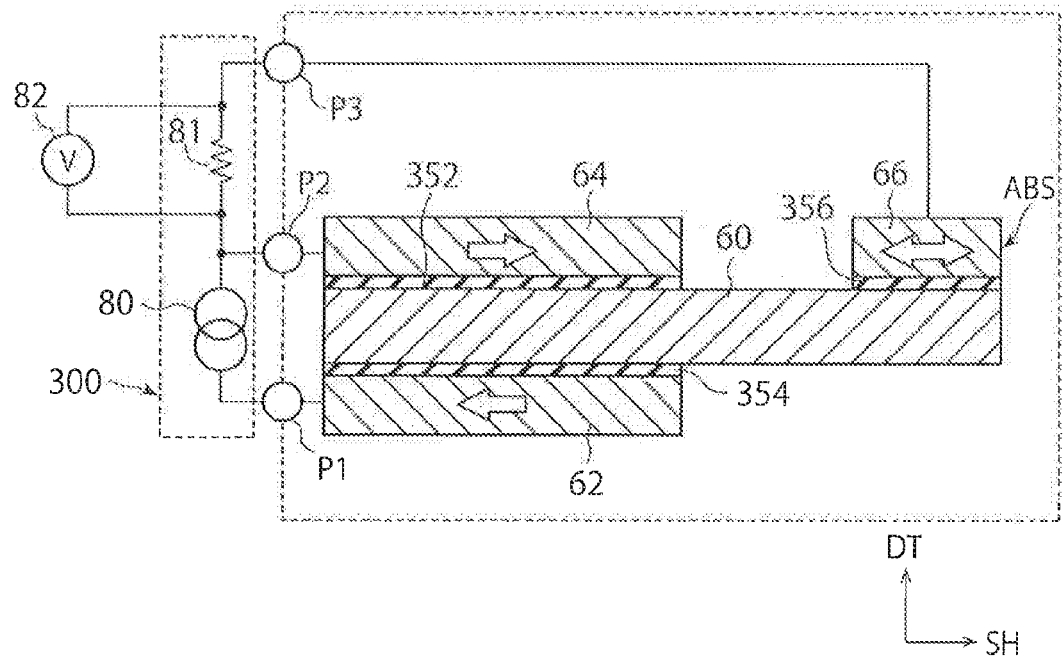
FIG. 22 is a cross-sectional view of a magnetic head according to a second modification of the second embodiment.
Figure 23:
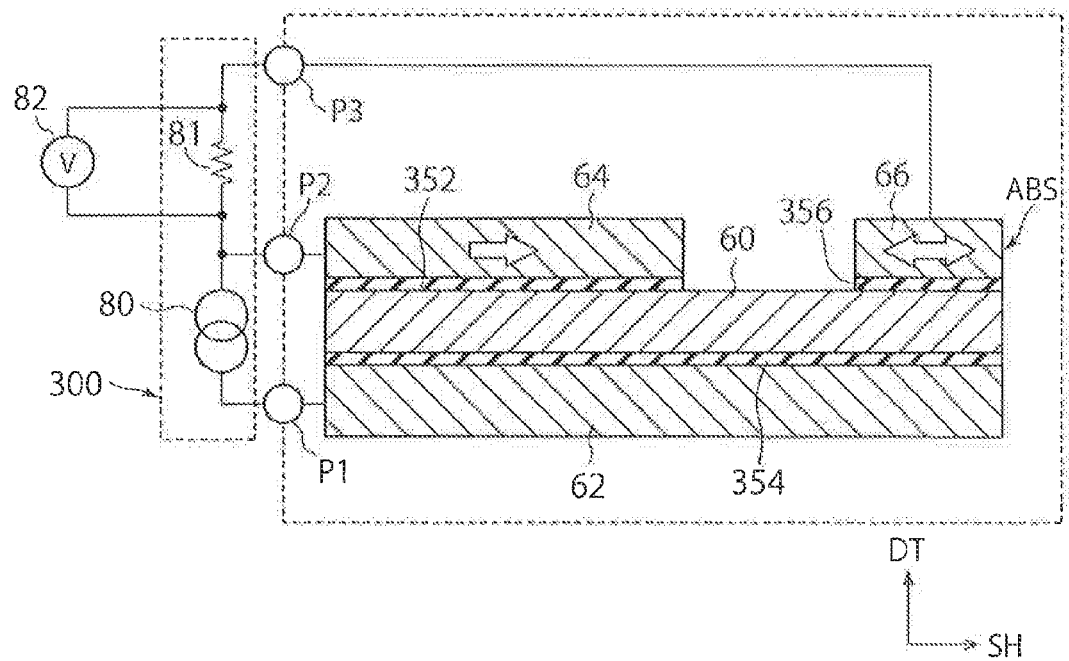
FIG. 23 is a cross-sectional view of a magnetic head according to a third modification of the second embodiment.

(Modifications)

Where the three magnetic terminals are provided on the bottom side, the same effect to increase outputs as that of a CPP-SV element can be expected. FIG. 22 shows a magnetic head according to such a modification. As the magnetic layer under a nonmagnetic base line 60 serves as an interfacial layer, a tunneling-conduction oxide layer 354 made of MgO or the like is formed. The areal resistance RA of the oxide layer 354 is preferably as low as possible. The interfacial layers of this embodiment shown in FIG. 15 are used as interfacial layers 352 and 354 of the magnetic layers on the nonmagnetic base line 60. Consequently, large interfacial spin polarization can be achieved in all the interfaces of the lower and upper magnetic layers.

Where a tunneling-conduction oxide layer is used in the perpendicular-current magnetoresistive element described in the first embodiment, electrical noise increases. In the spin accumulation element shown in FIG. 22, however, a layer of this embodiment having a lower areal resistance RA than 0.3 $\Omega\mu m^2$, for example, is used as the interfacial layer 356 of the detection terminal 66 that detects a voltage signal. Thus, the problem of increased electrical noise can be avoided. A CoFeB alloy with which excellent MgO crystals can be produced is preferably used as the magnetic layer 62 on the bottom side in FIG. 22. Further, in a case where a tunneling-conduction MgO layer having a relatively high areal resistance RA is used as the interfacial layer 354 in contact with the magnetic layer 62, the junction area between the magnetic layer 62 and the nonmagnetic layer 60 via the interfacial layer 354 may be increased, as shown in FIG. 23.

The second embodiment can provide a magnetoresistive head that has a low areal resistance RA and is capable of achieving a high output and a high S/N ratio.

Third Embodiment

A magnetic recording and reproducing apparatus according to a third embodiment will be described below.

The magnetic head according to any one of the first and second embodiments described above is incorporated into, for example, a recording and reproducing type magnetic head assembly, and further incorporated into a magnetic recording and reproducing apparatus (HDD). The magnetic recording and reproducing apparatus according to the third embodiment may have a reproducing function, and may have both a recording function and a reproducing function.

Figure 24:
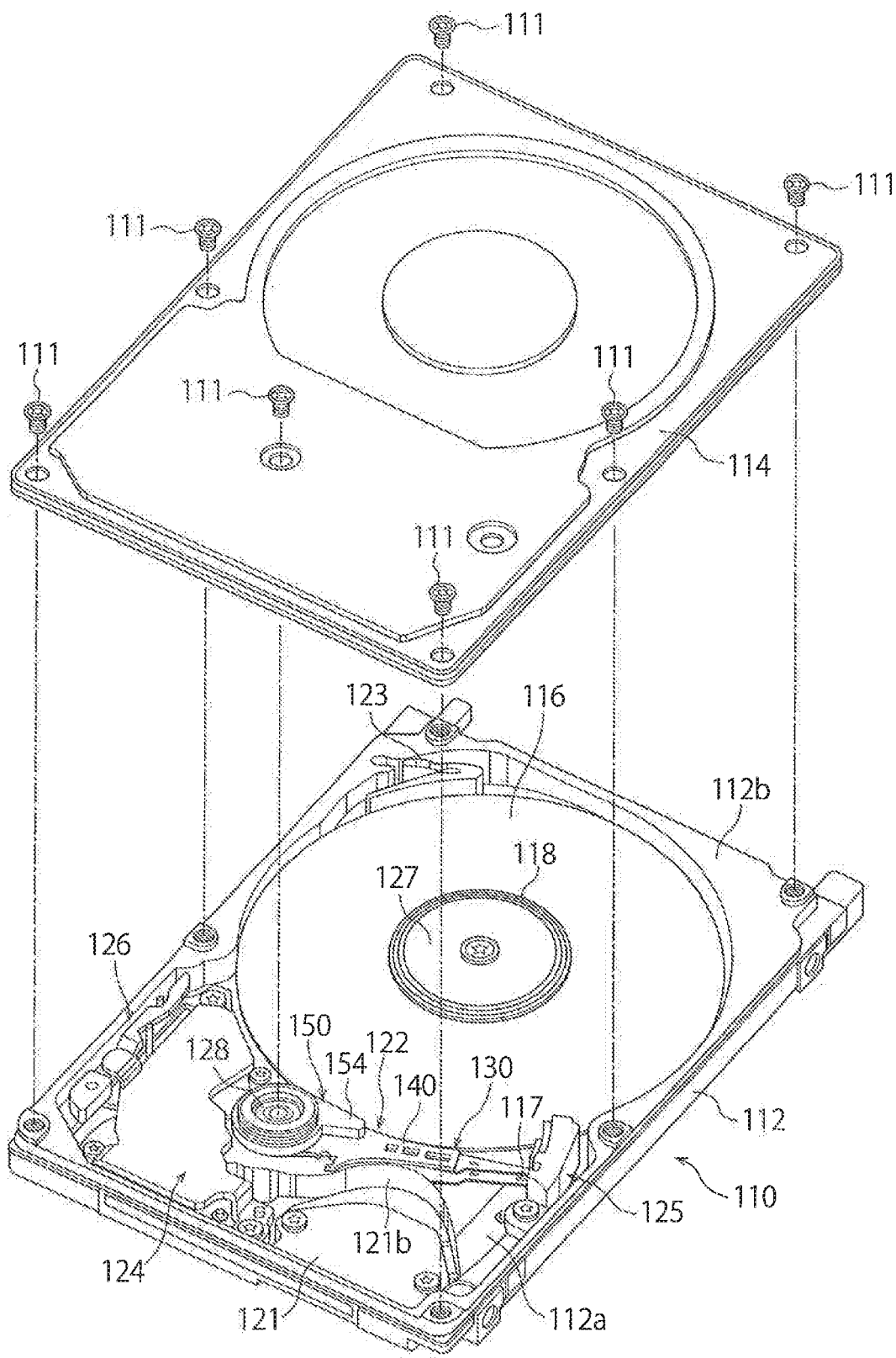
FIG. 24 is a perspective view of a magnetic recording/reproducing device according to a third embodiment.

FIG. 24 is a perspective view showing a structure of the magnetic recording and reproducing apparatus according to the third embodiment. As shown in FIG. 24, the magnetic recording and reproducing apparatus includes a housing 110. The housing 110 includes a base 112 in a rectangular box shape, of which the top face is open, and a top cover 114 to be fastened to the base 112 by a plurality of bolts 111 to close the opening on the top face of the base 112. The base 112 includes a bottom plate 112a in a rectangular shape, and a sidewall 112b standing along the periphery of the bottom plate 112a.

The housing 110 houses a magnetic disk 116 serving as a recording medium, and a spindle motor 118 serving as a driving unit for supporting and rotating the magnetic disk 116. The spindle motor 118 is disposed on the bottom plate 112a. The housing 110 has a size enabling the housing of plural, for example two, magnetic disks, and the spindle motor 118 is capable of supporting and driving two magnetic disks.

The housing 110 also houses a plurality of hard disk heads 117 for recording information to and reproducing information from the magnetic disk 116, a head stack assembly ("HSA") 122 for supporting the hard disk heads 117 so as to be freely moved relative to the magnetic disk 116, a voice coil motor ("VCM") 124 for pivoting and positioning the HSA 122, a ramp loading mechanism 125 for moving and holding the hard disk head 117 at a retracting position that is at a distance from the magnetic disk 116 when the hard disk head 117 reaches the outermost portion of the magnetic disk 116, a latch mechanism 126 for holding the HSA 122 at the retreating position when an impact is given to the HDD, and a substrate unit 121 including a preamplifier. A printed circuit hoard that is not shown is fastened by bolts to the outer surface of the bottom plate 112a of the base 112. The printed circuit board controls operations of the spindle motor 118, the VCM 124, and the hard disk heads 117 via the substrate unit 121. A circulation filter 123 for capturing dusts within the housing by driving a movable portion thereof is provided to a sidewall of the base 112 at a position outside the magnetic disk 116.

The magnetic disk 116 has a diameter of, for example, 65 mm (2.5 inches), and includes magnetic recording layers under the top face and above the bottom face. The magnetic disk 116 is coaxially engaged with a hub (not shown) of the spindle motor 118, and clamped by a clamp spring 127 to be fixed to the hub. In this manner, the magnetic disk 116 is supported to be in parallel with the bottom plate 112a of the base 112. The magnetic disk 116 is rotated by the spindle motor 118 at a predetermined speed, for example, 5400 rpm or 7200 rpm.

Figure 25:
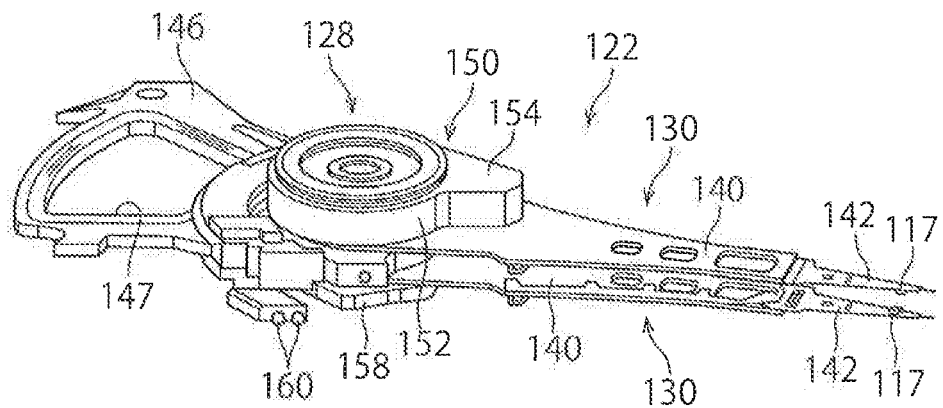
FIG. 25 is a perspective view of a head stack assembly.
Figure 26:
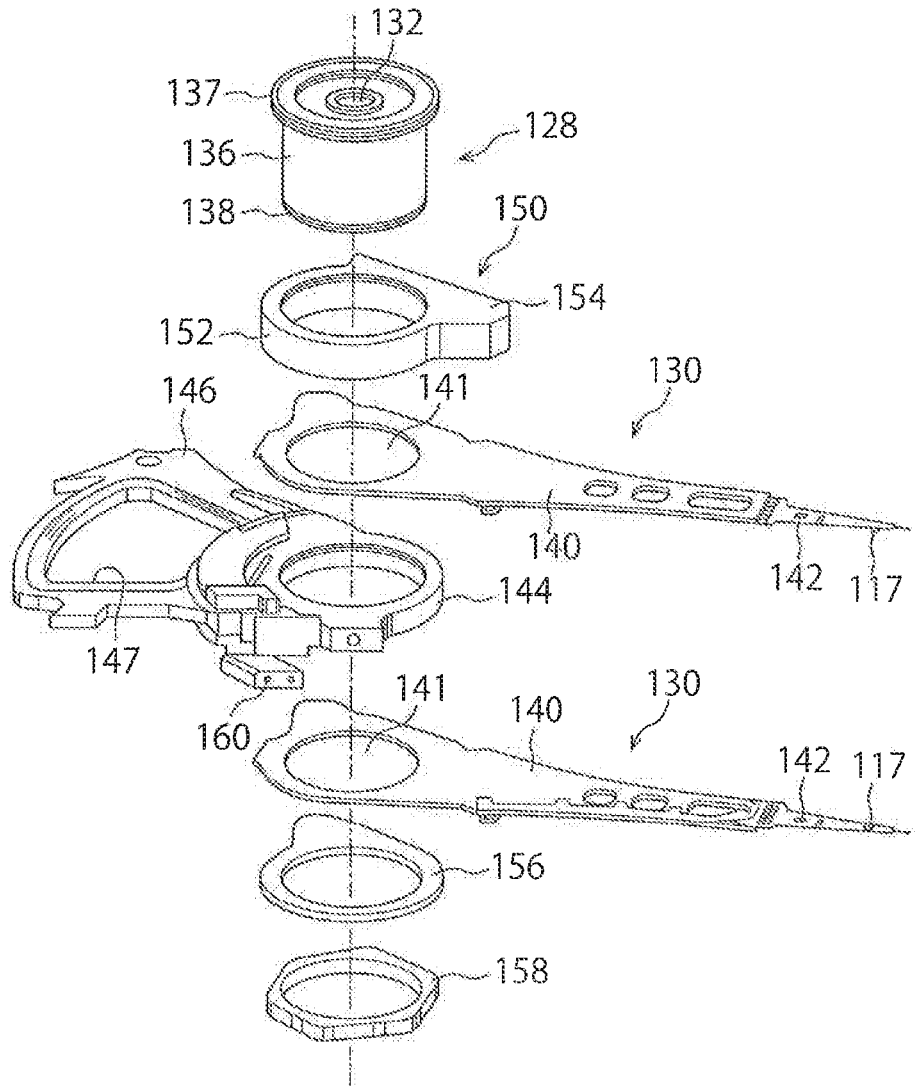
FIG. 26 is an exploded perspective view of the head stack assembly.

FIG. 25 is a perspective view showing the head stack assembly (HSA) 122 of the magnetic recording and reproducing apparatus according to the third embodiment, and FIG. 26 is an exploded perspective view of the HSA 122. As shown in FIGS. 25 and 26, the HSA 122 includes a bearing unit 128 that can be freely rotated, two head gimbal assemblies ("HGAs") 130 extending from the bearing unit 128, a spacer ring 144 disposed within the HGAs 130, and a dummy spacer 150.

The bearing unit 128 is located along the longitudinal direction of the base 112 at a distance from the rotation center of, and near the outer periphery of the magnetic disk 116. The bearing unit 128 includes a pivot axis 132 standing on the bottom plate 112a of the base 112, and sleeve 136 in a cylindrical shape, which is coaxially supported by the pivot axis 132 so as to be rotated freely around the pivot axis 132 via the bearings 134. A flange 137 in a ring shape is disposed on the upper portion of the sleeve 136, and a screw portion 138 is formed on the outer periphery of the lower portion. The sleeve 136 of the bearing unit 128 has a size, i.e., a length in the axial direction, sufficiently enough to fix, for example, at maximum of four HGAs and spacers between the adjacent HGAs 140.

In the third embodiment, the number of magnetic disk 116 is one. Accordingly, two HGAs 130, which are fewer than the maximum attachable number of four, are fixed to the bearing unit 128. Each HGA 130 includes an arm 140 extending from the bearing unit 128, a suspension 142 extending from the arm, and a hard disk head 117 supported at the extended end of the suspension via a gimbal portion.

The arm 140 has a laminate structure of, for example, stainless steel, aluminum, and stainless steel, and in a thin flat plate shape. A circular through-hole 141 is formed on one end, i.e., the base end thereof. The suspension 142 is formed of a narrow and long leaf spring, the base portion of which is fixed to an end of the arm 140 by spot welding or gluing so that the suspension 142 extends from the arm 140. The suspension 142 and the arm 140 may be integrally formed of the same material.

The hard disk head 117 is one of the magnetic heads according to the second embodiment, and includes a substantially rectangular slider (not shown) and a recording head formed on the slider. The hard disk head 117 is fixed to the gimbal portion formed at a tip portion of the suspension 142. Furthermore, the hard disk head 117 includes four electrodes, which are not shown. A relay flexible printed circuit board ("relay FPC") is disposed on the arm 140 and the suspension 142, and the hard disk head 117 is electrically connected to a main FPC 121b via the relay FPC.

The spacer ring 144 is formed of aluminum or the like to have a predetermined thickness and a predetermined outside diameter. A support frame 146 of a synthetic resin is integrally formed with the spacer ring 144 and extends outwardly from the spacer ring. A voice coil 147 of the VCM 124 is fixed to the support frame 146.

The dummy spacer 150 includes a spacer body 152 in an annular shape, and a balance adjusting portion 154 extending from the spacer body. The dummy spacer 150 is integrally formed of a metal such as stainless steel. The outside diameter of the spacer body 152 is the same as that of the spacer ring 144.

Therefore, the outside diameter of a portion of the spacer body 152 contacting the arm is the same as the outside diameter of a portion of the spacer ring 144 contacting the arm. The thickness of the spacer body 152 is the sum of the thicknesses of the arms of the HGAs, the number of which is fewer than the maximum number; two in this case, and the thicknesses of the spacer rings disposed therebetween.

The dummy spacer 150, the two HGAs 130, and the spacer ring 144 are engaged with the outer periphery of the sleeve 136 of the bearing unit 128 with the sleeve 136 being inserted into the inner hole of the spacer body 152, the through-hole 141 of the arm 140, and the inner hole of the spacer ring. Thus the dummy spacer 150, the two HGAs 130, and the spacer ring 144 are stacked on the flange 137 along the axial direction of the sleeve. The spacer body 152 of the dummy spacer 150 is engaged with the outer periphery of the sleeve 136 so as to be disposed between the flange 137 and one of the arms 140, and the spacer ring 144 is engaged with the outer periphery of the sleeve 136 so as to be disposed between the two arms 140. A washer 156 in an annular shape is engaged with the lower periphery of the sleeve 136.

The dummy spacer 150, the two arms 140, the spacer ring 144, and the washer 156 engaged with the outer periphery of the sleeve 136 are sandwiched between a nut 158 engaged with the screw portion 138 of the sleeve 136 and the flange 137 to be fixed to the outer periphery of the sleeve.

The two arms 140 are located at predetermined positions in the circumferential direction of the sleeve 136, and extend in the same direction from the sleeve. As a result, the two HGAs are integrally rotated with the sleeve 136, and face each other with a predetermined distance therebetween in parallel with the surface of the magnetic disk 116. The support frame 146 integrally formed with the spacer ring 144 extends from the bearing unit 128 in the opposite direction to the arms 140. Two terminals 160 in a pin shape project from the support frame 146, and electrically connect to the voice coil 147 via a wiring (not shown) embedded in the support frame 146.

The suspension 142 has lead lines (not shown) for writing and reading signals, which are electrically connected to respective electrodes of the magnetic head incorporated into the slider. Furthermore, an electrode pad (not shown) is provided to the magnetic head assembly 130.

A signal processing unit (not shown) for writing signals to and reading signals from the magnetic recording medium using the magnetic head is provided. The signal processing unit is disposed on the back side of the magnetic recording and reproducing apparatus shown in FIG. 24, for example. The input and output lines of the signal processing unit are connected to the electrode pad and electrically coupled to the magnetic head.

Thus, the magnetic recording and reproducing apparatus according to the third embodiment includes a magnetic recording medium, any of the magnetic heads according to one of the first and second embodiments, a movable unit (movement controller) for separating the magnetic recording medium and the hard disk head from each other, or moving the magnetic recording medium and the hard disk head relative to each other under a contact state, a position controller for positioning the hard disk head at a predetermined recording position of the magnetic recording medium, and a signal processing unit for writing signals to and reading signals from the magnetic recording medium using the hard disk head. The recording medium disk 116 can be used as the aforementioned magnetic recording medium. The aforementioned movable unit may include a slider. Furthermore, the aforementioned position controller may include an HSA 122.

Figure 27:
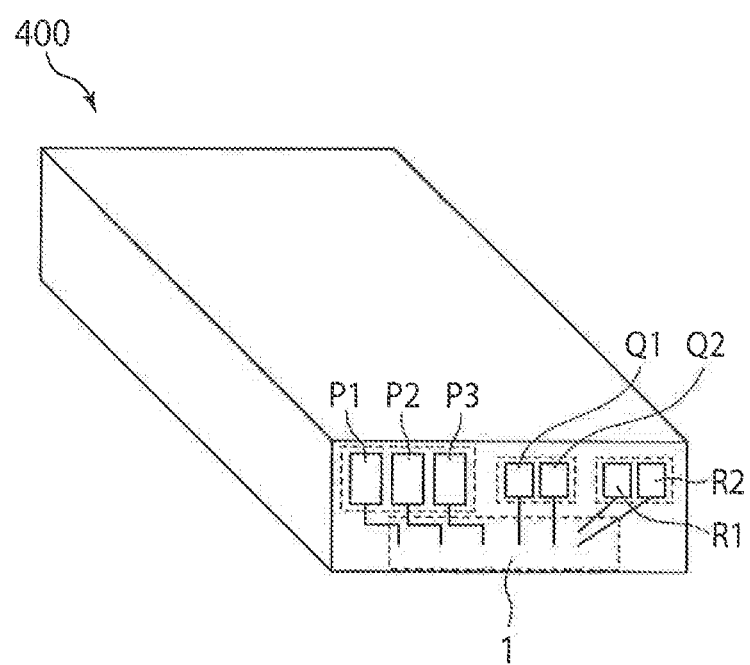
FIG. 27 is a diagram showing external lead terminals provided on a slider.

When the magnetic disk 116 is rotated, and the actuator arm 140 is caused to pivot by the voice coil motor 124 to load the slider onto the magnetic disk 116, the air bearing surface (ABS) of the slider on which the hard disk head is mounted is held above the surface of the magnetic disk 116 at a predetermined floating distance therefrom. In this manner, the information recorded on the magnetic disk 116 is read based on the aforementioned principle. FIG. 27 shows the ABS of a slider 400. The external lead terminals P1, P2, P3 of the three-terminal, non-local spin valve element 1 in the magnetic head are disposed at the ABS of the slider 400. The ABS includes external lead terminals Q1, Q2 of recording, and external lead terminals R1, R2 for adjusting the floating amount of the slider.

The third embodiment can provide a magnetoresistive head that has a low areal resistance RA and is capable of achieving a high output and a high S/N ratio.

A magnetic head according to a first aspect of an embodiment includes the magnetoresistive element of any one of the above described embodiments as a reproducing element.

A magnetic recording/reproducing device according to a second aspect of an embodiment includes: a magnetic recording medium; a magnetic head assembly including: the magnetic head according to the first aspect of the embodiment; a head slider having the magnetic head mounted thereon; a suspension having the head slider mounted on one end thereof; and an actuator arm connected to the other end of the suspension; and a signal processing unit configured to perform signal writing and reading on the magnetic recording medium, using the magnetic head mounted on the magnetic head assembly.

A method of manufacturing a magnetoresistive element according to a third aspect of an embodiment, the method includes: forming a first magnetic layer on a substrate; forming, on the first magnetic layer, a layer of at least one metal element of Cu, Au, and Ag; forming a metal layer containing Al on the layer containing the at least one metal element; oxidizing the metal layer containing Al by plasma oxidation and ion assisted oxidation; irradiating a surface of the oxidized metal layer containing Al with an ion beam, to perform etching on the surface; forming a Mg layer on the etched metal layer containing Al by heating the substrate at a temperature of 300° C. at a maximum; and forming a second magnetic layer on the Mg layer.

A method of manufacturing a magnetoresistive element according to a fourth aspect of an embodiment, the method includes: forming a first magnetic layer on a substrate; forming, on the first magnetic layer, a layer of at least one metal element of Cu, Au, and Ag; forming a metal layer containing Al on the layer containing the at least one metal element; oxidizing the metal layer containing Al by plasma oxidation and ion assisted oxidation; irradiating a surface of the oxidized metal layer containing Al with an ion beam, to perform etching on the surface; forming a Mg layer on the etched metal layer containing Al; performing a heat treatment to the Mg layer at a temperature of 300° C. at a maximum in a vacuum film formation chamber; and forming a second magnetic layer on the Mg layer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising
a first magnetic layer, a second magnetic layer, and an intermediate layer disposed between the first magnetic layer and the second magnetic layer, the intermediate layer including: a first layer containing oxygen and at least one element of Cu, Au, and Ag; and a second layer containing Mg and oxygen, the second layer being disposed between the first layer and the second magnetic layer.

2. The magnetoresistive element according to claim 1, wherein the first layer includes: a metal layer containing the at least one of Cu, Au, or Aq; and an oxide layer disposed between the metal layer and the second layer.

3. The magnetoresistive element according to claim 2, wherein the oxide layer contains Al.

4. The magnetoresistive element according to claim 2, wherein the metal layer has a thickness between 0.25 nm and 1.5 nm.

5. The magnetoresistive element according to claim 1, wherein the second magnetic layer includes a magnetic alloy layer containing Ge.

6. The magnetoresistive element according to claim 1, wherein the second magnetic layer includes at least one of a FeCoGe alloy layer and a FeCoMnGe alloy layer.

7. A magnetic reproducing device comprising:
a magnetic recording medium; and
a hard disk head comprising the magnetoresistive element according to claim 1.

8. The device according to claim 7, further comprising a head stack assembly configured to support the hard disk head.

9. The device according to claim 8, further comprising a signal processing unit.

10. A magnetoresistive element comprising
a first magnetic layer, a second magnetic layer, and an intermediate layer disposed between the first magnetic layer and the second magnetic layer, wherein the intermediate layer includes an oxide layer containing at least one metal element of Cu, Au, and Ag, a nonmagnetic layer containing a nonmagnetic element, and an Mg layer, wherein the metal element has a distribution with a peak on a side of the first magnetic layer, the nonmagnetic element has a distribution with a peak near a middle portion between the first magnetic layer and the second magnetic layer, and the Mg layer has a distribution with a peak on a side of the second magnetic layer.

11. The magnetoresistive element according to claim 10, wherein the nonmagnetic element is Al.

12. The magnetoresistive element according to claim 10, wherein the second magnetic layer includes a magnetic alloy layer containing Ge.

13. The magnetoresistive element according to claim 10, wherein the second magnetic layer includes at least one of a FeCoGe alloy layer and a FeCoMnGe alloy layer.

* * * * *

UNITED STATES PATENT AND TRADEMARK OFFICE
CERTIFICATE OF CORRECTION

PATENT NO. : 9,837,105 B2
APPLICATION NO. : 15/200454
DATED : December 5, 2017
INVENTOR(S) : Susumu Hashimoto et al.

Page 1 of 1

It is certified that error appears in the above-identified patent and that said Letters Patent is hereby corrected as shown below:

In the Claims

Claim 2, Column 22, Line 42, change "or Aq;" to --or Ag;--.

Signed and Sealed this
Third Day of April, 2018

Andrei Iancu
*Director of the United States Patent and Trademark Office*